(12) United States Patent
Houis

(10) Patent No.: US 11,815,533 B2
(45) Date of Patent: Nov. 14, 2023

(54) CURRENT SENSOR SYSTEM

(71) Applicant: Melexis Technologies SA, Bevaix (CH)

(72) Inventor: Simon Houis, Bevaix (CH)

(73) Assignee: MELEXIS TECHNOLOGIES SA, Bevaix (CH)

(*) Notice: Subject to any disclaimer, the term of this patent is extended or adjusted under 35 U.S.C. 154(b) by 20 days.

(21) Appl. No.: 17/479,181

(22) Filed: Sep. 20, 2021

(65) Prior Publication Data

US 2022/0091161 A1    Mar. 24, 2022

(30) Foreign Application Priority Data

Sep. 24, 2020    (EP) .................................. 20198220

(51) Int. Cl.
*G01R 19/00*    (2006.01)
*G01R 15/14*    (2006.01)
*G01R 33/022*    (2006.01)

(52) U.S. Cl.
CPC ....... *G01R 19/0007* (2013.01); *G01R 15/148* (2013.01); *G01R 33/022* (2013.01)

(58) Field of Classification Search
CPC ............ G01R 19/0007; G01R 19/0092; G01R 15/148; G01R 15/207; G01R 15/202; G01R 33/022
See application file for complete search history.

(56) References Cited

U.S. PATENT DOCUMENTS

| | | | | |
|---|---|---|---|---|
| 6,310,470 B1 * | 10/2001 | Hebing | ............... | G01R 15/205 324/117 R |
| 2005/0030004 A1 * | 2/2005 | Takatsuka | ............ | G01R 15/202 324/117 H |
| 2008/0143329 A1 * | 6/2008 | Ishihara | ............... | G01R 15/207 324/252 |
| 2015/0204915 A1 * | 7/2015 | Okuyama | ............ | G01R 33/093 324/117 R |
| 2017/0219634 A1 * | 8/2017 | Shimizu | ............... | G01R 33/091 |

(Continued)

FOREIGN PATENT DOCUMENTS

| | | |
|---|---|---|
| DE | 10110254 A1 | 9/2002 |
| WO | 2019072421 A1 | 4/2019 |

OTHER PUBLICATIONS

Extended Search Report from corresponding EP Application No. EP20198220.4, dated Mar. 17, 2021.

*Primary Examiner* — Dominic E Hawkins
(74) *Attorney, Agent, or Firm* — WORKMAN NYDEGGER

(57)    ABSTRACT

A current sensor system for accurately measuring an AC electrical current having frequencies up to 2 kHz, the system comprising: an electrical conductor (e.g. busbar) for conducting said AC current thereby creating a first magnetic field; a magnetic sensor device for measuring a magnetic field component or gradient; an object (e.g. a metal plate) having an electrically conductive surface arranged in the vicinity of said conductor for allowing eddy currents to flow in said surface, thereby creating a second magnetic field which is superimposed with the first magnetic field; wherein the magnetic sensor device is configured for determining the current as a signal or value proportional to the measured component or gradient. The metal plate may have an opening. The current sensor system may further comprise a shielding.

11 Claims, 16 Drawing Sheets

(56) References Cited

U.S. PATENT DOCUMENTS

| | | | |
|---|---|---|---|
| 2017/0285076 A1* | 10/2017 | Okuyama | G01R 33/025 |
| 2018/0306843 A1 | 10/2018 | Bussing et al. | |
| 2019/0170793 A1* | 6/2019 | Okuyama | G01R 33/025 |
| 2019/0187183 A1* | 6/2019 | Okuyama | G01R 15/148 |
| 2019/0250193 A1* | 8/2019 | Futakuchi | G01R 33/072 |
| 2020/0057120 A1 | 2/2020 | Belin et al. | |
| 2020/0300894 A1 | 9/2020 | Brusius et al. | |

* cited by examiner $I = K*(Bz1-Bz2)$ $I = K*(\Delta Bz) = K*(Bz1-Bz2)$
or
$I = K*(\Delta Bz) = K*(Bz3-Bz4)$
or
$I = K*Bz1$, or $I = K*Bz2$, or $I = K*Bz3$, or $I = K*Bz4$ $$I = K*(\Delta Bz) = K*(Bz1-Bz2)$$
or
$$I = K*(\Delta Bz) = K*(Bz3-Bz4)$$
or
$$I = K*Bz1, \text{ or } I = K*Bz2, \text{ or } I = K*Bz3, \text{ or } I = K*Bz4$$

$I = K*(\Delta Bz) = K*(Bz1-Bz2)$
or
$I = K*(\Delta Bz) = K*(Bz3-Bz4)$

CURRENT SENSOR SYSTEM

FIELD OF THE INVENTION

The present invention relates in general to the field of current sensor systems, and more in particular to magnetic current sensors. More in particular, the present invention is related to a current sensor system capable of accurate measurement of an AC current having frequencies up to about 2 kHz.

BACKGROUND OF THE INVENTION

Different kinds of current sensors are known in the art, for example (1) current sensors using a shunt resistor, (2) using a current transformer, (3) or using a magnetic sensor.

In current sensors using a shunt resistor, a voltage is measured over the shunt resistor, and the current value can be determined by dividing the measured voltage value and the resistor value. A disadvantage of this type is that the measurement circuit is not electrically isolated from the load. A current transformer includes primary and secondary coils. While this type of current sensor provides galvanic separation, it is usually very bulky. Current sensors based on magnetic sensors provide both galvanic separation and can be very compact.

Known current sensors are typically designed to measure DC currents or low frequency currents, for example currents having a frequency of about 50 Hz or about 60 Hz.

Various electrical motor types exist, for example: so called DC brushed motors, DC brushless motors, AC brushless motors, linear motors, stepper motors, etc. In electrical vehicles, the following motor types are typically used: DC Series Motor, Brushless DC Motor, Permanent Magnet Synchronous Motor (PMSM), Three Phase AC Induction Motors, Switched Reluctance Motors (SRM).

Various electrical circuits for driving and/or controlling and/or monitoring electrical motors exist. In some of these circuits the actual currents provided to the motor need to be measured. These currents may have a magnitude of several tens or even hundreds of Amperes, and may have a frequency or frequency components up to several kHz. These currents are typically provided to the motor via so called "busbars". Busbars often come in the form of a metallic strip or bar, for example a copper bar.

It is known that, when AC currents flow through an electrical conductor, a phenomenon known as "skin effect" will occur. This causes the effective electrical resistance of the electrical conductor to increase. The higher the frequency of the electrical current, the higher the effective resistance of the electrical conductor.

It is a challenge to measure an AC current with high accuracy.

SUMMARY OF THE INVENTION

It is an object of embodiments of the present invention to provide a current sensor system for measuring an AC current, for example an AC current flowing through a busbar.

It is an object of embodiments of the present invention to provide a current sensor system for measuring an AC current with improved accuracy.

It is an object of embodiments of the present invention to provide a current sensor system for measuring an AC current having frequencies up to 2 kHz with improved accuracy.

It is an object of embodiments of the present invention to provide a current sensor system for measuring the instantaneous or momentary amplitude of an AC current having frequencies up to 2 kHz with improved accuracy.

It is an object of embodiments of the present invention to provide a current sensor system for measuring an AC current with improved accuracy, in a simple manner, e.g. without having to perform spectral analysis (e.g. Fourier analysis), and/or without having to analyse the current waveform in the time domain (e.g. sinusoidal, square, triangular).

It is an object of embodiments of the present invention to provide a current sensor system capable of measuring an AC current with an absolute accuracy within +/−5%, or an absolute accuracy within +/−4%, or an absolute accuracy within +/−3%, or an absolute accuracy within +/−2%, or an absolute accuracy within +/−1%, the AC current having one or more frequencies (or spectral components) in the range from about 100 Hz to about 2000 Hz.

These and other objects are accomplished by a current sensor according to embodiments of the present invention.

According to a first aspect, the present invention provides a current sensor system for measuring an AC electrical current having frequencies in a predefined frequency range, the system comprising: an electrical conductor configured for conducting said AC electrical current thereby creating a first magnetic field; a magnetic sensor device configured for measuring a magnetic field component or a magnetic field difference; the current sensor system further comprises a metal plate or an electrically conductive surface arranged in the vicinity of said electrical conductor for allowing eddy currents to flow in said surface thereby creating a second magnetic field which is superimposed with the first magnetic field; wherein the magnetic sensor device is configured for determining a magnitude of the AC electrical current as a signal or value proportional to said measured magnetic field component or said magnetic field gradient.

It is an advantage of this current sensor system that it allows accurate measurement of the AC electrical current, which may have frequencies up to about 2 kHz, in a fast and simple manner, without requiring heavy processing, without having to perform spectral analysis techniques (e.g. Fourier analysis).

The inventors discovered that the AC current can be measured with improved accuracy by addition of an electrically conductive surface, e.g. a metal plate, or a copper layer of a printed circuit board (PCB), etc. They surprisingly found that the magnetic field induced by the eddy currents can improve the accuracy, which is totally unexpected, and highly counter-intuitive because it is well known and commonly accepted/believed that eddy currents negatively influence measurements rather than improving them.

It is an advantage of the present invention that the AC current is determined by multiplication of a measured magnetic field gradient or a magnetic field component, in contrast to systems measuring a peak current, which is then for example multiplied by 1.41 (square root of 2), because this is only accurate if the waveform of the AC current is a perfect sinusoidal signal. It is an advantage of the present invention that the measurement is accuracy for any AC waveform, e.g. sinusoidal, square, triangular, etc.

In an embodiment, the sensor device has a first magnetic sensor located at a first sensor location, and has a second magnetic sensor located at a second sensor location, and the second magnetic field (i.e. the field caused by the eddy currents) has a same direction as the first magnetic field (i.e. the field caused by the current flowing in the electrical conductor, e.g. busbar) at the first sensor location, and has a direction opposite to the first magnetic field at the second sensor location.

The electrically conductive surface may be galvanically separate from said electrical conductor and from said magnetic sensor device.

The electrically conductive surface may be substantially planar or may have a planar portion. For example, the object can be a conductive plate, e.g. a copper plate or an aluminum plate.

In an embodiment, the magnetic sensor device is configured for determining the amplitude of the AC current at a frequency of at least 5.0 kHz, or at least 8 kHz, or at least 10 kHz.

Preferably the current sensor system is a coreless sensor system.

In an embodiment, the sensor device is arranged at a location where a superposition of the first magnetic field and the second magnetic field has a substantially constant magnitude in a frequency range comprising the range from 100 Hz to 2 kHz.

With "substantially constant" is meant within a predefined tolerance margin, e.g. smaller than +/−4%, or smaller than +/−3%, or smaller than +/−2%.

The effect of locating the sensor device at a location where said superposition has a substantially constant magnitude in said frequency range, is that the total magnetic field seen by the sensor device will be substantially constant over frequency and in turn the error between the determined AC current and actual AC current will be minimized.

In most embodiment, neither the size, nor the dimensions are critical, as long as they are "sufficiently large", in comparison with the dimensions of the electrical conductor. For example, the size of the metal plate or conductive surface may be rectangular, although that is not absolutely required, and it suffices that the length and the width of the metal plate or conductive surface are in the same order of magnitude as the width of the busbar.

In an embodiment, at least 90%, or at least 95% or at least 96%, or at least 97%, or at least 98%, or at least 99% of the power of the AC current is situated below 2000 Hz.

In an embodiment the magnetic sensor device is an integrated semiconductor device (also referred to as "chip"), and the electrical conductor is arranged outside of said integrated semiconductor device.

In an embodiment, the electrically conductive surface is a metal sheet or a metal layer.

In other words, in this embodiment the current system comprises: an electrical conductor, a magnetic sensor device, and a metal plate or metal sheet, for example made of copper or a copper alloy, e.g. made of aluminum or an aluminium alloy.

In an embodiment, the magnetic sensor device is configured for measuring a first magnetic field component at a first sensor location, and for measuring a second magnetic field component (parallel to the first magnetic field component) at a second sensor location spaced from the first sensor location, and for determining a magnetic field difference or a magnetic field gradient based on a difference between said first and said second magnetic field component; and for determining said magnitude of the AC electrical current in accordance with the formula: $I=K*(\Delta Bz)$, where I is the magnitude of the AC electrical current to be measured, K is a predefined constant independent of frequency, and $\Delta Bz$ is the magnetic field difference or magnetic field gradient.

In an embodiment, the magnetic sensor device is configured for measuring a first magnetic field component at a first sensor location, and for determining said magnitude of the AC electrical current in accordance with the formula: $I=K*Bz$, where I is the magnitude of the AC electrical current to be measured, K is a predefined constant independent of frequency, and Bz is the measured first magnetic field component.

In this embodiment, the magnetic sensor device is configured for determining the AC electrical current as a value proportional to the magnetic field component value.

In an embodiment, this current sensor system further comprises a shielding.

In an embodiment, the sensor device, and the electrical conductor, and the metal plate (or the electrically conducting surface or layer) are arranged relative to one another such that the current value obtained by one of the above mentioned formulas provides substantially the same result for an first sinusoidal current having a predefined amplitude and a frequency of 100 Hz, and for a second sinusoidal current having the same predefined amplitude and a frequency of 2000 Hz, within a predefined tolerance margin of +/−4%, or +/−3%, or +/−2%, or +/−1%.

In an embodiment, the electrical conductor comprises a first and a second beam-shaped conductor portion, both extending in a longitudinal direction, and spaced apart from each other to form a gap between them; and wherein the metal plate or the electrically conductive surface is arranged parallel to, and at a predefined distance from the electrical conductor to form a gap or slit between them; and wherein the magnetic sensor device is arranged inside said gap or slit.

This gap is illustrated for example in FIG. 1(d) and FIG. 1(f) by the dotted region.

In an embodiment, the magnetic sensor device is configured for measuring said first and said second magnetic field component, both oriented in a height direction of the electrical conductor; and the first and second sensor location are spaced apart in the transverse direction.

The current sensor device may have a semiconductor substrate oriented parallel to said surface, and may comprise two horizontal Hall plates, spaced apart by a distance dx in the range from 1.0 to 2.5 mm, or from 1.5 to 2.5 mm, or from 1.5 to 2.2 mm, e.g. equal to about 1.9 mm. The current sensor device may be arranged such that its semiconductor substrate is located at a height position (in the Z-direction) substantially halfway the thickness of the beam-shaped conductor portions (e.g. at Tc/2).

In an embodiment, the magnetic sensor device is configured for measuring said first and said second magnetic field component, both oriented in the transverse direction of the electrical conductor; and the first and second sensor location are spaced apart in a height direction of the electrical conductor.

In an embodiment, the magnetic sensor device has a semiconductor substrate, and is arranged such that its semiconductor substrate is oriented perpendicular to the metal plate or the conductive surface and is located substantially in the middle between the two beam-shaped conductor portions.

The magnetic sensor device may comprise two horizontal Hall plates, spaced apart by a distance (dz) in the range from 1.0 to 2.5 mm, or from 1.5 to 2.5 mm, or from 1.5 to 2.2 mm, e.g. equal to about 1.9 mm.

In an embodiment, the electrical conductor has an elongated shape extending in a first direction and has a width extending in a transverse direction, perpendicular to the first direction; and the electrical conductor comprises a first cut-out extending from a first side of the electrical conductor over at least half of the transversal width, and has a second cut-out extending from a second side of the electrical conductor over at least half of the transversal width, the first cut-out and the second cut-out defining a transverse passage zone between them; and the metal plate or the electrically conductive surface has an opening or a non-conductive region located in the vicinity of said transverse passage zone; and the metal plate or the electrically conductive surface is located at a first distance from the electrical conductor; and the magnetic sensor device is arranged in the vicinity of said opening or of said non-conductive region at a second distance from the electrical conductor smaller than, or larger than, or substantially equal to the first distance (g).

In other words, three cases are contemplated. In a first case, illustrated in FIG. 4(c), the sensor device is located "between" the electrical conductor (e.g. busbar) and the conductive surface (e.g. metal plate). In a second case, illustrated in FIG. 4(d), the metal plate or conducting surface is located in a plane between the electrical conductor (e.g. busbar) and the sensor device, or stated in other words, the sensor device is located "above" the metal plate. In a third case, illustrated in FIG. 4(e), the sensor device is located substantially in the same (virtual) plane as the metal plate or the conductive surface.

The opening can be a through-hole through the metal plate.

The opening or the non-conductive region may have a square or rectangular shape. The opening may have a length and a width in the range from about 50% to about 150% of the distance dx between the Hall elements, or from about 90% to about 150%, or from about 100% to about 150%. For example, if dx=2.0 mm, the opening may have a length from about 2.0 to 3.0 mm, and a width of about 2.0 to about 3.0 mm.

In an embodiment, the magnetic sensor device is configured for measuring said first magnetic field component and said second magnetic field component, both oriented in a height direction (or "thickness direction") of the electrical conductor; and the first and second sensor location are spaced apart in the longitudinal direction of the electrical conductor.

The magnetic sensor device may have a semiconductor substrate oriented parallel to a top surface of the electrical conductor facing the conducting surface and is preferably located "above" the transverse passage zone between the two cut-outs.

The magnetic sensor device may comprise two horizontal Hall plates, spaced apart by a distance in the range from 1.0 to 2.5 mm, or from 1.5 to 2.5 mm, or from 1.5 to 2.2 mm, e.g. equal to about 1.9 mm. The magnetic sensor may be configured for measuring a magnetic field gradient (dBz/dy) oriented in a direction (Z) perpendicular to the semiconductor substrate along the longitudinal direction (Y) of the electrical conductor.

In an embodiment, the current sensor device comprises two sensor devices mounted on a printed circuit board, the first sensor device configured for determining a first current, the second sensor device configured for determining a second current. The PCB may be oriented substantially parallel to the metal plate or conductive surface, or perpendicular to the metal plate or conductive surface. The sensor devices may each comprise two horizontal Hall elements, configured for determining a magnetic field gradient dBz/dy oriented in the Z-direction along the Y-direction, e.g. as shown in FIG. 4(e). The sensor devices may each comprise two vertical Hall elements, configured for determining a magnetic field gradient dBz/dy oriented in the Z-direction along the Y-direction, e.g. as shown in FIG. 4(h). Such embodiments provide redundancy and are particularly suited for functional safety applications.

In an embodiment, the electrical conductor has an elongated shape extending in a first direction, and a width extending in a transverse direction, perpendicular to the first direction; and the electrical conductor comprises a first cut-out extending from a first side of the electrical conductor over at least half of the transversal width, and has a second cut-out extending from a second side of the electrical conductor over at least half of the transversal width, the first cut-out and the second cut-out defining a transverse passage zone between them; and the metal plate or the conductive surface is parallel to the electrical conductor and is located on only one side of an imaginary plane oriented perpendicular to the first direction and situated in the middle between the first and second cut-out; and the metal plate or the conductive surface is located at a first distance from the electrical conductor; and the magnetic sensor device is arranged in the vicinity of said transverse passage zone at a second distance from the electrical conductor smaller than, larger than, or substantially equal to the first distance.

In an embodiment, the magnetic sensor device is configured for measuring said first magnetic field component at a first sensor location and said second magnetic field component at a second sensor location, both oriented in a height direction of the electrical conductor; and the first and second sensor locations are spaced apart in the longitudinal direction.

The magnetic sensor device may have a semiconductor substrate oriented parallel to a top surface of the electrical conductor facing the conducting surface and is preferably located "above" the transverse passage zone between the two cut-outs.

The magnetic sensor device may comprise two horizontal Hall plates, spaced apart by a distance in the range from 1.0 to 2.5 mm, or from 1.5 to 2.5 mm, or from 1.5 to 2.2 mm, e.g. equal to about 1.9 mm. The magnetic sensor may be configured for measuring a magnetic field gradient (dBz/dy) oriented in the height direction (Z), e.g. perpendicular to the metal plate, along the longitudinal direction (Y) of the electrical conductor.

In an embodiment, the orthogonal projection of at least one of the magnetic sensor elements, or of both magnetic sensor elements on a virtual plane containing the metal plate or the electrical conductor surface, are located outside the metal plate (or conductive surface). Or stated differently, in this embodiment, one or both imaginary lines passing through the magnetic sensor elements and orthogonal to the metal plate (or electrically conductive surface), do not intersect the metal plate (or electrically conductive surface).

In an embodiment, the electrical conductor has an elongated shape extending in a first direction and has a width extending in a transverse direction, perpendicular to the first direction; and the current sensor system further comprises a magnetic shielding completely surrounding a portion of the electrical conductor or forming a bridge over a portion of the electrical conductor; and the metal plate or electrically conductive surface is oriented parallel to the electrical conductor, and is located at a first distance from the electrical conductor defining a gap between them; and the magnetic sensor device is arranged in the gap between said electrical conductor portion and the conductive surface.

The electrical conductor may have a beam-shape, with a rectangular cross section.

The metal plate or electrically conducting surface may be part of the shielding or may abut the shielding. The shielding may be U-shaped or V-shaped or Omega-shaped, e.g. as illustrated in FIG. 8(a).

The shielding may be galvanically separated from the conductive surface or may be in galvanic contact with the conductive surface.

In an embodiment, the magnetic sensor device is configured for measuring a magnetic field component oriented in the transverse direction of the electrical conductor.

The magnetic sensor device may comprise a vertical Hall element, or a disk-shaped integrated magnetic concentrator (IMC) with two horizontal Hall elements arranged at a periphery of the IMC.

In an embodiment, the conductive surface comprises one or more conductive layers, e.g. one or more copper layers of a printed circuit board, and at least one of the following is valid:
  (i) the thickness of the conductive surface is a value in the range from about 30 to 220 μm, (e.g. equal to about 35 μm, or equal to about 105 μm, or equal to about 200 μm); and/or
  (ii) the distance between the conductive surface and the magnetic sensitive elements may be a value in the range from 0.2 mm to 5.0 mm, or from 0.2 mm to 3.0 mm; and/or
  (iii) the dimensions of the conductive surface (e.g. length and width of a rectangular shaped) may be values in the range from We*(50% to 500%), or in the range from We*(50% to 300%), where We is a width of the electrical conductor (e.g. bus bar width).

In an embodiment, the conductive surface is part of a (e.g. solid) metal plate, and at least one of the following is valid:
  (i) the thickness of the conductive surface may be a value in the range from about 0.5 mm to 10 mm, or from 0.5 mm to 5.0 mm; and/or
  (ii) the distance between the conductive surface and the magnetic sensitive elements may be a value in the range from 0.5 mm to 10 cm, or from 0.5 mm to 5.0 cm; and/or
  (iii) the dimensions of the conductive surface (e.g. length and width of a rectangular shaped) may be values in the range from We*(50% to 500%), or in the range from We*(50% to 300%), wherein We is a width of the electrical conductor (e.g. bus bar width).

According to another aspect, the present invention is also directed to a three-phase current sensor system for measuring three AC electrical current having frequencies in a predefined frequency range, the system comprising: a first electrical conductor configured for conducting a first AC electrical current thereby creating a first magnetic field, and a first magnetic sensor device configured for measuring a first magnetic field component or a first magnetic field difference of the first magnetic field; a second electrical conductor configured for conducting a second AC electrical current thereby creating a second magnetic field, and a second magnetic sensor device configured for measuring a second magnetic field component or a second magnetic field difference of the second magnetic field; a third electrical conductor configured for conducting a third AC electrical current thereby creating a third magnetic field, and a third magnetic sensor device configured for measuring a third magnetic field component or a third magnetic field difference of the third magnetic field; wherein the current sensor system further comprises a first metal plate or a first electrically conductive surface arranged in the vicinity of said first electrical conductor for allowing eddy currents to flow in said first plate or said first surface thereby creating a fourth magnetic field which is superimposed with the first magnetic field; and further comprises a second metal plate or a second electrically conductive surface arranged in the vicinity of said second electrical conductor for allowing eddy currents to flow in said second plate or said second surface thereby creating a fifth magnetic field which is superimposed with the second magnetic field; and further comprises a third metal plate or a third electrically conductive surface arranged in the vicinity of said third electrical conductor for allowing eddy currents to flow in said third plate or said third surface thereby creating a sixth magnetic field which is superimposed with the third magnetic field; and wherein the first magnetic sensor device is configured for determining a magnitude of the first AC electrical current as a signal or value proportional to said measured first magnetic field component or said first magnetic field gradient; and wherein the second magnetic sensor device is configured for determining a magnitude of the second AC electrical current as a signal or value proportional to said measured second magnetic field component or said second magnetic field gradient; and wherein the third magnetic sensor device is configured for determining a magnitude of the third AC electrical current as a signal or value proportional to said measured third magnetic field component or said third magnetic field gradient.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 1(b) shows the electrical conductor in top view.

FIG. 1(a) shows a cross-sectional view of the sensor system in plane A-A of FIG. 1(b).

FIG. 1(c) shows a perspective view, and FIG. 1(d) shows a front view.

FIG. 2, comprising FIGS. 2(a) and 2(b)

FIG. 3, comprising FIGS. 3(a) and 3(b)

FIG. 4, comprising

FIG. 6, comprising

FIG. 6(a) shows a cross section of FIG. 6(b) according to A-A.

FIG. 6(b) shows the electrical conductor in top view.

FIG. 6(c) shows a top view of an exemplary metal plate.

FIG. 6(d) shows an example of the current sensor system of FIG. 6(a) to (c) in top view and shows an example of eddy currents flowing in such a plate.

FIG. 6(e) to FIG. 6(g) show examples of the current sensor system of FIG. 6 in perspective view.

FIG. 7 show simulation results for the current sensor system of FIG. 6.

FIG. 8(a) shows a cross section of the current sensor system.

FIG. 8(b) shows a perspective view of the system without the magnetic shielding.

FIG. 8(c) is a schematic representation of a magnetic sensor device with a vertical Hall sensor, as may be used in the system of FIG. 8(b).

Figure 1A:
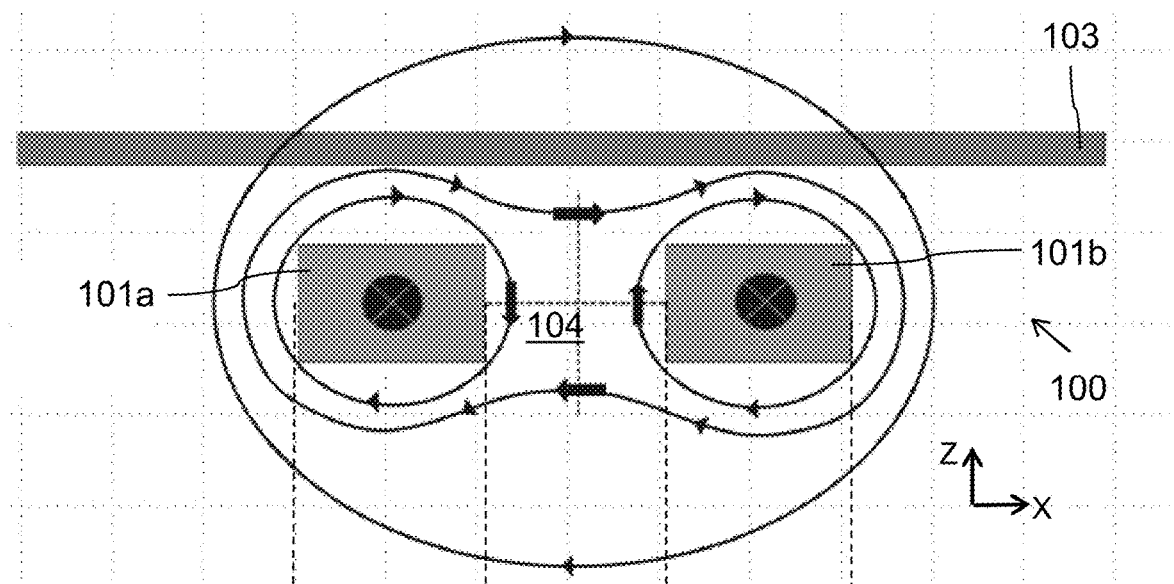
FIG. 1(a) to FIG. 1(d) illustrate a first embodiment of a current sensor system according to the present invention, wherein the current sensor system comprises two electrical conductor portions spaced apart from each other to form a gap between them, and wherein a magnetic sensor device is arranged substantially inside said gap, and wherein a metal plate is arranged in the vicinity of the electrical conductor.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some, but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In this document, the expression "current sensor system" or "current sensor arrangement" mean the same. They refer to a system or arrangement comprising an electrical conductor (e.g. a busbar) for conducting an electrical current, and a current sensor device for measuring that current, and an electrically conductive surface (e.g. a metal plate or a metal layer of a printed circuit board).

It is known that complex numbers can be represented by a magnitude (or amplitude) and a phase, or by a real part and an imaginary part. For example, the complex number "1+i" can also be represented by a vector having an amplitude (or magnitude) of 2 and a phase of 45°.

In this document, the term "magnetic field gradient" dBz/dy refers to a spatial gradient of the magnetic field component Bz along the Y-direction. In practice, the division by dy is often omitted.

In this document, the term "magnetic field difference" ΔBz is used to indicate a difference between two magnetic field components oriented in parallel.

In this document, the terms "magnetic field gradient" and "magnetic field difference" can be used interchangeably, unless explicitly mentioned otherwise or clear from the context otherwise.

The present invention relates to current sensors based on magnetic sensors, also referred to as "magnetic current sensors", as may be used in industrial or automotive applications, e.g. for measuring one or more currents provided to an electrical motor, e.g. in electrical or hybrid vehicles. Such electrical motors may be driven using relatively large AC currents, for example substantially sinusoidal currents having amplitudes of tens or even hundreds of amperes. The present invention is particularly concerned with accurately measuring such AC currents.

As already mentioned in the background section, It is known that, when AC currents flow through an electrical conductor, a phenomenon known as "skin effect" will occur. This causes the effective electrical resistance of the electrical conductor to increase. The higher the frequency of the electrical current, the higher the effective resistance of the electrical conductor.

The inventors of the present invention had the task of providing a sensor system capable of measuring an AC current flowing through an electrical conductor, e.g. a busbar, with improved AC accuracy. The busbar may be a busbar comprising two parallel conductor portions with a gap (or slit) in between as shown in FIG. 1(b) or may be a busbar with a zig-zag formed by two transversal cut-outs as shown in FIG. 4(f) or FIG. 6(b). The AC current may for example be a sinusoidal current having any frequency from e.g. 100 Hz to e.g. 2000 Hz.

A specific problem that occurs when trying to measure currents having a relatively high frequency (e.g. higher than 50 Hz or 60 Hz) is that a phenomenon known as the "skin effect" occurs, which causes the current density to increase near the outer periphery of the electrical conductor, and causes the current density to decrease near the center of the electrical conductor. The inventors have found that this not only changes the effective resistance of the busbar, but also changes the magnetic field around the electrical conductor. However, as far as is known to the inventors, the way in which the skin effect changes the magnetic field around the conductor, cannot easily be described. As the frequency of the AC current increases towards a frequency of 2000 Hz, this effect becomes more and more pronounced, and a determination of the AC current as a value proportional to a measured magnetic field component or a measured magnetic field gradient, without any correction, will result in an error, typically in the order of about 10%.

Since the error (and thus also the correction) is frequency dependent, a logical approach would be to analyse the frequency content of the AC signal to be measured and correct the measured value accordingly. But performing frequency analysis (e.g. by means of a Fourier transform) has several disadvantages, such as requiring considerable processing power, having to use a sampling window of typically at least 16 or 32 samples, thus causing a delay, etc., which is disadvantageous, especially in motor control. The inventors wanted to find another solution and started experimenting.

Stated in simple terms, they came to the idea of trying to improve the accuracy of the measurement by adding a metal plate in the vicinity of the system. While they expected that this would actually make the measurements even worse, they surprisingly found that by adding a metal plate, it is possible to improve the accuracy of the measurement.

This result is highly counter-intuitive. Indeed, while it is known that the magnetic field generated by an AC current flowing through the electrical conductor (e.g. the busbar) would cause eddy currents to flow in the metal plate if the plate is sufficiently close to the conductor, and that these eddy currents will typically generate a second magnetic field that counteracts the original magnetic field, the path and intensity of such eddy currents is not well defined, and even more so, the magnetic field generated by these eddy currents is not well defined. Yet, the inventors surprisingly discovered that these eddy currents can actually improve the AC measurement accuracy, meaning that in these current sensor systems, the eddy currents may reduce, e.g. largely reduce, or even almost fully compensate the negative influence of the skin effect. As far as is known to the inventors, both the "skin effect" and "eddy currents" are typically both considered as "unwanted effects" or "disturbance effects", not as "helping effects", and no systems are known where one of them can reduce the negative influence of the other. Yet, that is exactly what the present invention exploits. This is one of the underlying ideas of the present invention.

Or stated slightly differently, the present invention provides a current sensor system for measuring an AC electrical current having frequencies in a predefined frequency range (e.g. from DC up to 2000 Hz, or from 100 Hz to 2000 Hz). Or stated differently, the present invention provides a current sensor system for measuring an AC electrical current having a frequency spectrum with spectral peaks or spectral components with a significant fraction of the signal power (e.g. at least 1%, or at least 2%, or at least 3%, or at least 4%, or at least 5%, or at least 8%, or at least 10%, or at least 15%, or at least 20%, or at least 25%, or at least 30%, or at least 40% of the total power), located in the range from about 100 Hz to about 2000 Hz.

The system comprises: an electrical conductor, (e.g. a busbar), for conducting said AC electrical current, thereby creating a first magnetic field. The system further comprises a magnetic sensor device configured for measuring at least one characteristic of a magnetic field, e.g. a magnetic field component, or a magnetic field difference, or a magnetic field gradient. The current sensor system further comprises an object (e.g. a printed circuit board (PCB) or a metallic plate, e.g. a copper plate or an aluminum plate) having an electrically conductive surface, arranged in the vicinity of said electrical conductor (e.g. busbar) for allowing eddy currents to flow in said surface, thereby creating a second magnetic field which is superimposed with the first magnetic field. The magnetic sensor device is further configured for determining a magnitude, e.g. an instantaneous magnitude of the AC electrical current as a signal or value proportional to the measured magnetic field component or proportional to the magnetic field gradient.

It is an advantage of this current sensor system that it allows accurate measurement of the AC electrical current, which may have one or more frequencies up to about 2 kHz, in a fast and simple manner, without requiring heavy processing, without having to perform spectral analysis techniques (e.g. Fourier analysis).

The inventors discovered that the AC current can be measured with improved accuracy by addition of an electrically conductive surface in the vicinity of the busbar. They surprisingly found that the magnetic field induced by the eddy currents can improve the accuracy, which is totally unexpected, because it is well known and commonly accepted/believed that eddy currents negatively influence measurements rather than improving them.

It is an advantage of the present invention that the instantaneous value of the AC current can be determined without requiring any knowledge of the frequency spectrum of the waveform, or the shape of the waveform in the time domain (e.g. sinusoidal, square wave or block wave, triangular or sawtooth, etc.).

While the object may be a solid piece of metal, e.g. a solid metal plate (e.g. having a thickness in the range from 1 mm to 5 mm, or from 1 mm to 50 mm), or may for example comprise one copper layer of a printed circuit board (PCB) having a typical thickness in the range from 30 μm to 40 μm, or may comprise a plurality of three (or two or four or more than four) layers of a printed circuit board (PCB), each having a thickness in the range from 30 μm to 40 μm, thus forming a total thickness of about 3×35 μm=about 105 μm, or other objects with an electrically conductive layer or coating, the present invention will be described assuming that the object is a metal plate, for ease of the description, but the present invention is not limited thereto.

The electrically conductive surface is preferably galvanically separate from the electrical conductor and from said magnetic sensor device, e.g. from a power or ground voltage thereof.

The electrically conductive surface may be substantially planar or may have a substantially planar portion. In some embodiments, the conductive surface may have a non-conductive portion, or the metal plate may have an opening, as will be described further.

Referring now to the figures.

FIG. 1(a) to FIG. 1(d) illustrate a first embodiment of a current sensor system 100 according to the present invention, comprising an electrical conductor 101, a magnetic sensor device 102 and a metal plate 103. The electrical conductor 101 comprises two electrical conductor portions 101a, 101b spaced apart from each to form a gap 104 (or opening or through-hole or slit) between them. The magnetic sensor device 102 is arranged substantially inside said gap or opening. The metal plate 103 is arranged in the vicinity of the electrical conductor portions 101a, 101b, e.g. at a distance from about 1 mm to about 10 cm, or at a distance from about 3 mm to about 3 cm from the busbar. In the example of FIG. 1(b), a cross-section of the first conductor portion 101a and a cross-section of the second conductor portion 101b are equally large, hence each conductor portion will guide 50% of the total current I passing through the electrical conductor 101, but the present invention is not limited thereto, and another ratio of cross sections may also be used, e.g. a ratio in the range from about 20% to about 80%, or from about 30% to about 70%, or from about 40% to about 60%. The current sensor device is not shown in FIG. 1(a), but see e.g. FIG. 1(c) or FIG. 1(d).

FIG. 1(b) shows a portion of the electrical conductor 101 in top view. The sensor device and the metal plate are not shown in FIG. 1(b), but see e.g. FIG. 1(c) and FIG. 1(d).

Figure 1B:
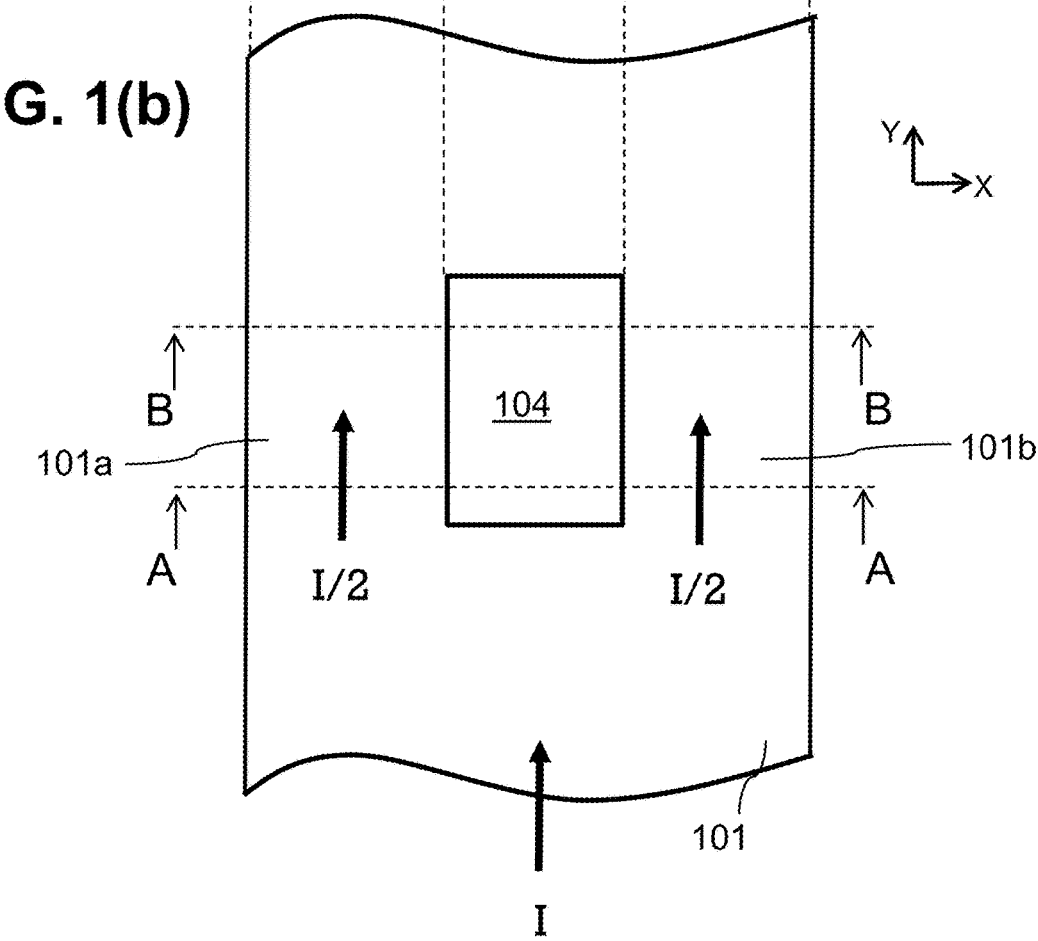

FIG. 1(a) shows a cross-sectional view of the sensor system in plane A-A of FIG. 1(b). In the example, both conductor portions have a rectangular cross-section, but the present invention is not limited thereto and will also work with other cross sections, for example circular. FIG. 1(a) also shows field lines and magnetic field vectors (black arrows) at various locations inside the gap 104 between the two conductor portions. As described above, when an AC current flows through the electrical conductor portions 101a, 101b, a time-varying magnetic field will be created by said current, and eddy currents will flow in the metal plate, which will create a second magnetic field, but as mentioned above, the actual paths and magnitudes of the eddy currents or the magnetic field created thereby, are not precisely known, and are not easy to describe in mathematical form. It will be discussed further (e.g. in FIG. 2 and FIG. 3) how these eddy currents can improve the accuracy of the measurements, but first a physical arrangement of the various elements of the system will be described.

Figure 1C:
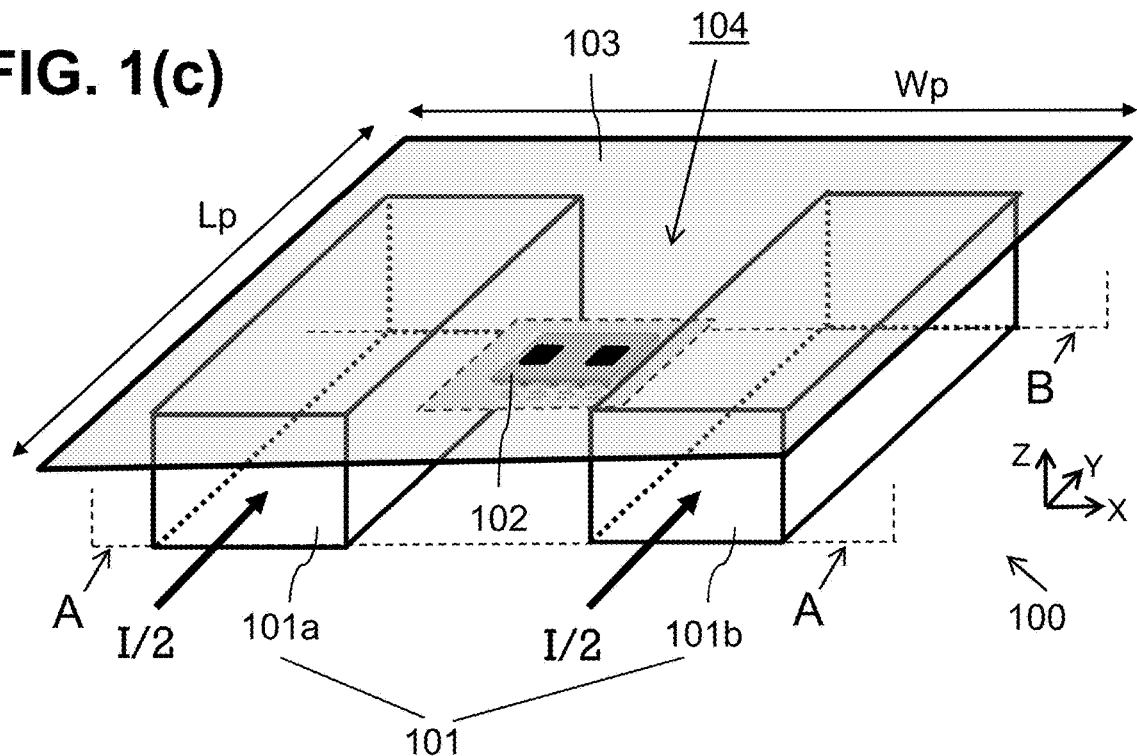

FIG. 1(c) shows the current sensor system 100 in perspective view, where the metal plate is represented as a semi-transparent rectangle. Also shown is a magnetic sensor device in the form of a packaged integrated circuit 102 arranged between the two conductor portions 101a, 101b. The magnetic sensor device 102 shown in FIG. 1(c) comprises a semiconductor substrate with two horizontal Hall elements (indicated by black squares) spaced apart over a predefined distance dx in a transverse direction X of the electrical conductor 101. (Indeed, as can be seen in FIG. 1(b), the electrical conductor extends in the Y direction, perpendicular to the X-direction).

Figure 1D:
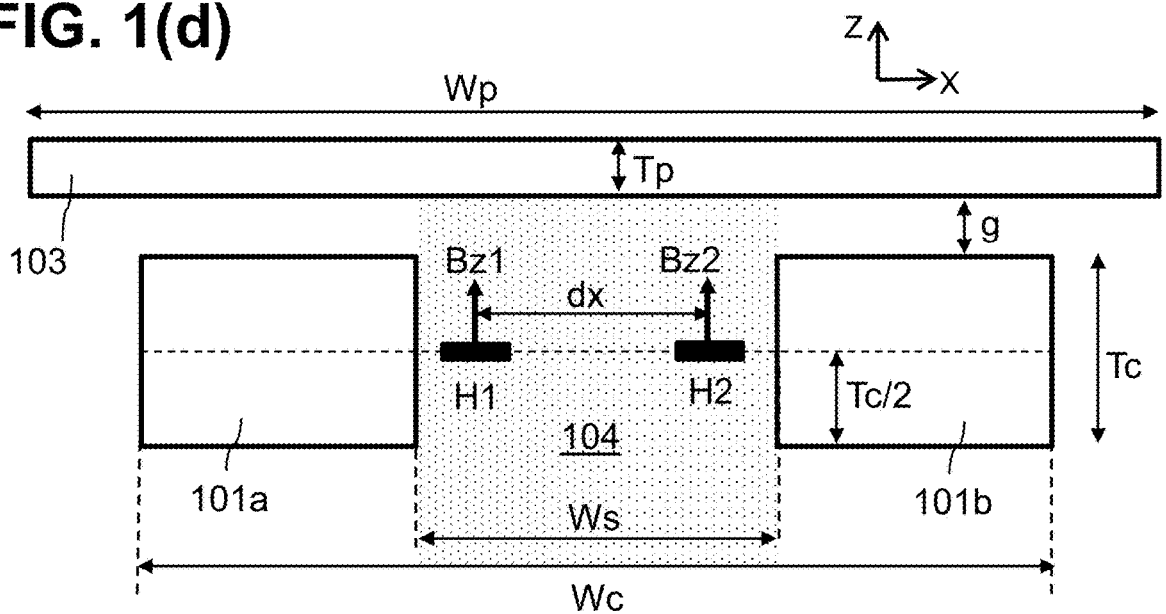

FIG. 1(d) shows a front view of the current sensor system 100. The metal plate may be arranged at a distance "g" of at least 0.5 mm, or at least 1.0 mm from the top of busbar. Preferably the distance g is smaller than 10 cm, or smaller than 5 cm.

The magnetic sensor device 102 may be configured for measuring a first magnetic field component Bz1 oriented in the Z-direction using a first horizontal Hall element H1, and for measuring a second magnetic field component Bz2 using a second horizontal Hall element H2, spaced at a transversal distance dx from the first horizontal Hall element H1, and the sensor device 102 may be configured for determining a difference ΔBz between these two values, e.g. in accordance with the formula: ΔBz=Bz1−Bz2, and may be further configured for determining the magnitude of the AC current in accordance with the following formula: I=K*(Bz1−Bz2), where K is a predetermined constant, independent of the waveform of the AC current, and independent of the frequency spectrum of the AC current. The value of K may be determined in known manners, e.g. by simulation, or by calibration, or in other suitable manners, and may be stored in a non-volatile memory 931, 1031 of the current sensor device.

The surprising effect does not reside in the formula itself, or in the gradiometric measurement, but in the accuracy achieved by this formula, thanks to the presence of the metal plate 103, despite the skin effect, even for frequencies up to 2000 Hz. In order to appreciate this improvement, it is noted that without the metal plate, the error of the AC current measurement may be about 10%. Thanks to the present invention, this error can be reduced to about +/−5%, or without +/−4%, or within +/−3%, or within +/−2%, as will be demonstrated in FIG. 2 and FIG. 3.

Preferably the magnetic sensor elements H1, H2 are located substantially halfway between the bottom surface and the top surface of the electrical conductor portions 101a, 101b in the height direction (Z), although that is not absolutely required. And preferably the two sensor elements H1, H2 are located symmetrically between the two electrical conductor portions 101a, 101b in the X-direction, although that is not absolutely required either (as will become clear when discussion FIG. 2(b)).

It was also found that the dimensions of the current sensor system 100, e.g. the length Lp and the width Wp of the metal plate 103 are not critical for getting an improvement, nor is the exact position of the current sensor device 102. That said, the accuracy of the measurement may vary mainly as a function of the distance "g" between the metal plate 103 and the busbar 101 and/or as a function of the thickness Tp or conductivity of the conductive surface. As a rule of thumb, it can be appreciated that the accuracy of the AC current measurement increases as the distance "g" between the metal plate 103 and the electrical conductor portions 101a, 101b decreases, and as the thickness Tp of the metal plate increases.

As an example, the electrical conductor (e.g. busbar) 101 may for example have a total width We of about 3 mm to about 15 mm, and may have a thickness Tc of about 2.0 mm to about 5.0 mm. The thickness Tp of the metal plate 103 may be a value in the range from about 0.5 mm to 10 mm, or from 0.5 mm to 5.0 mm. The distance between the conductive surface 103 and the magnetic sensitive elements H1, H2 may be a value in the range from 0.5 mm to 10 cm, or from 0.5 mm to 5.0 mm. The length Lp and the width Wp of the plate 103 are preferably at least We*50%, or at least 75%*Wc, or at least Wc, but larger values may also be used, for example from We*50% to We*200%. In the example of FIG. 1(c) and FIG. 1(d) the metal plate 103 is substantially square, and Lp=Wp=approximately 125% of the conductor width Wc. The length Lp may be equal to the width Wp, but that is not required.

In a variant (not shown) of the current sensor system 100 of FIG. 1(c), the magnetic sensor device 102 is rotated by 90° about the X-axis, such that its semiconductor substrate is perpendicular to the metal plate 103 and perpendicular to the longitudinal direction Y of the electrical conductor 101, and the sensor device comprises for example two vertical Hall elements, or two Magneto-resistive elements for measuring magnetic field values oriented in the Z-direction.

Figure 1E:
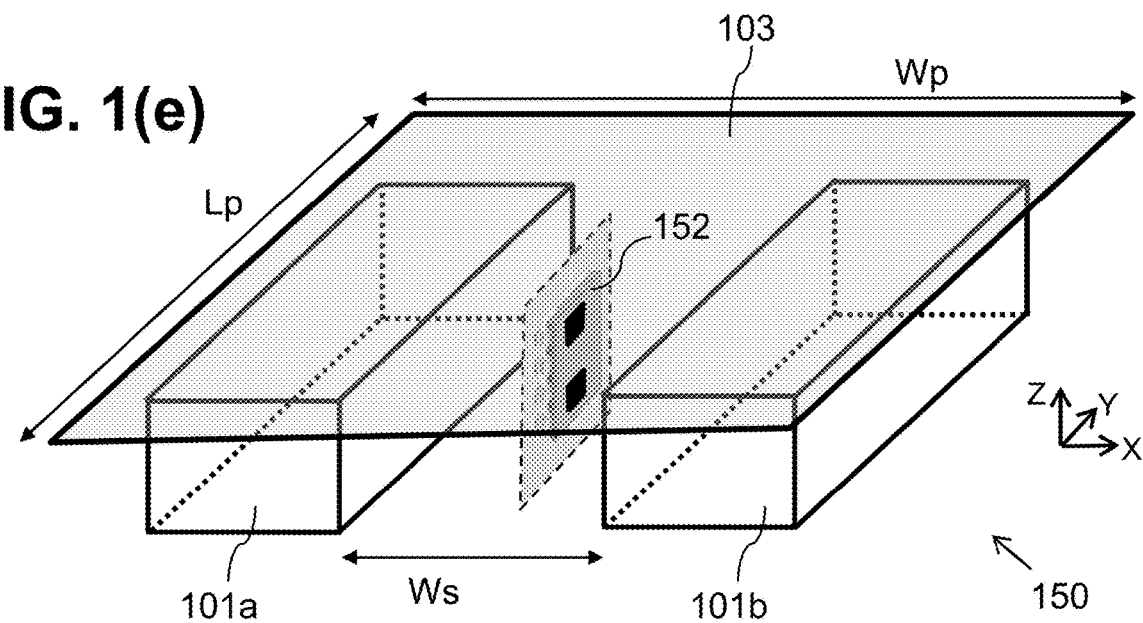
FIG. 1(e) to FIG. 1(f) show a variant of the system shown in FIG. 1(a) to FIG. 1(d), according to another embodiment of the present invention.
Figure 1F:
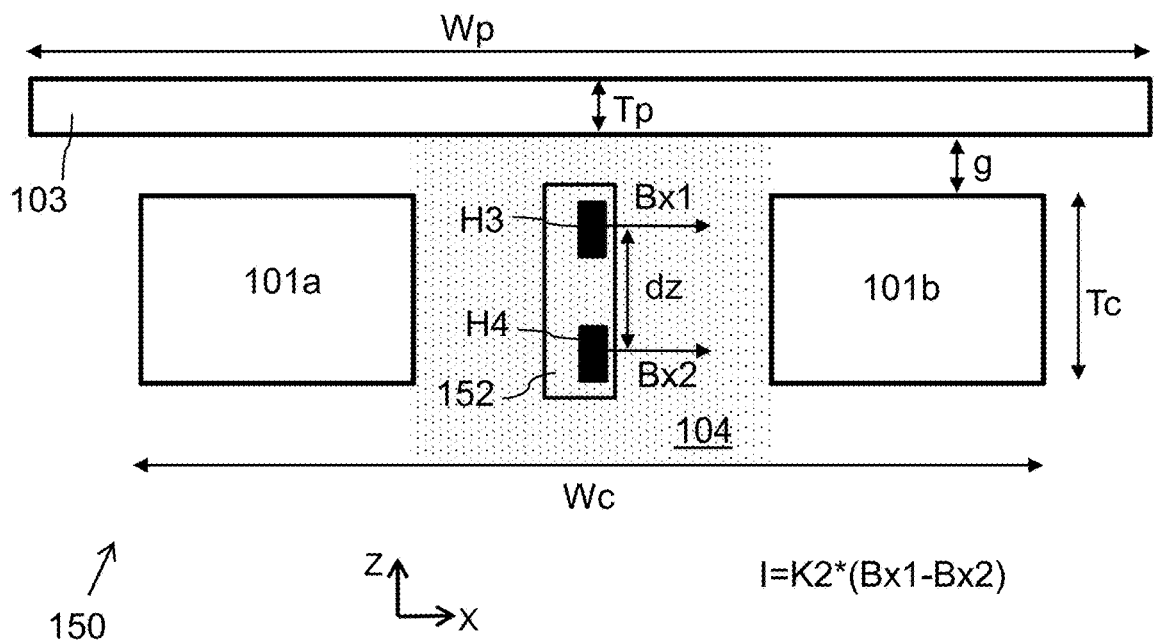

Before describing simulation results of the current sensor system 100 of FIG. 1(a) to FIG. 1(d), another variant of the current sensor system 100 will be described, with reference to FIG. 1(e) and FIG. 1(f). The most important difference between the current sensor system 100 of FIG. 1(a) to FIG. 1(d) and the current sensor system 150 of FIG. 1(e) to FIG. 1(f) is the orientation of the magnetic sensor device 152. As can be seen in FIG. 1(e), the substrate of the magnetic sensor device 152 is oriented perpendicular to the metal plate 103, and parallel to the longitudinal axis Y of the electrical conductor 101.

Referring to FIG. 1(f), the magnetic sensor device 152 may be configured for measuring a first magnetic field component Bx1 oriented in a transverse direction X of the electrical conductor (e.g. busbar) using a first horizontal Hall element H3, and for measuring a second magnetic field component Bx2 using a second horizontal Hall element H4, spaced at a distance dz from the first horizontal Hall element H3, and may be configured for determining a difference ΔBx between these two values, e.g. in accordance with the formula: ΔBx=Bx1−Bx2, and may be configured for determining the magnitude of the AC current in accordance with the following formula: I=K2*(Bx1−Bx2), where K2 is a predetermined constant, independent of the waveform of the AC current, and substantially independent of the specific frequency spectrum of the AC current (assuming that the AC current has spectral peaks or spectral lobes or spectral components below or up to 2000 Hz). The value of K2 may be determined in known manners, e.g. by simulation, or by calibration, or in other suitable manners, and may be stored in a non-volatile memory 931, 1031 of the current sensor device. It is an advantage of this embodiment that the semiconductor substrate of the sensor device 152 can be oriented parallel to the YZ-plane, because this requires only a "relatively narrow slit" between the two conductor portions 101a and 101b, i.e. a relatively small value for the distance Ws between the two conductor portions.

In a variant (not shown) of the current sensor system 150, the sensor device is rotated over 900 about the Z-axis, such that the semiconductor surface is parallel to the XZ plane, and the semiconductor device contains two vertical Hall elements, or two magneto-resistive elements configured for measuring the value of Bx1 and Bx2 oriented in the X-direction, similar to FIG. 1(f).

The dimensions of the metal plate 103 are not critical for the invention to work. In an embodiment, the width Wp of the metal plate is smaller than the outer width We of the two electrical conductor portions. In an embodiment, the width Wp of the metal plate is substantially equal to the outer width We of the two electrical conductor portions. In an embodiment, the width Wp of the metal plate is larger than the outer width We of the two electrical conductor portions, e.g. at least 20% larger, or at least 50% larger.

While not shown, in all embodiments of FIG. 1(a) to FIG. 1(f), and especially in the embodiment of FIG. 1(e) and FIG.

1(f), the current sensor system 150 may optionally comprise a second metal plate parallel to the first metal plate, arranged on the opposite side of the busbar 101, such that the two electrical conductor portions 101a, 101b are located between the two metal plates. In this embodiment, the sensor elements H3, H4 are equally far from the metal plates, which may further improve the accuracy.

Figures 2A, 2B:
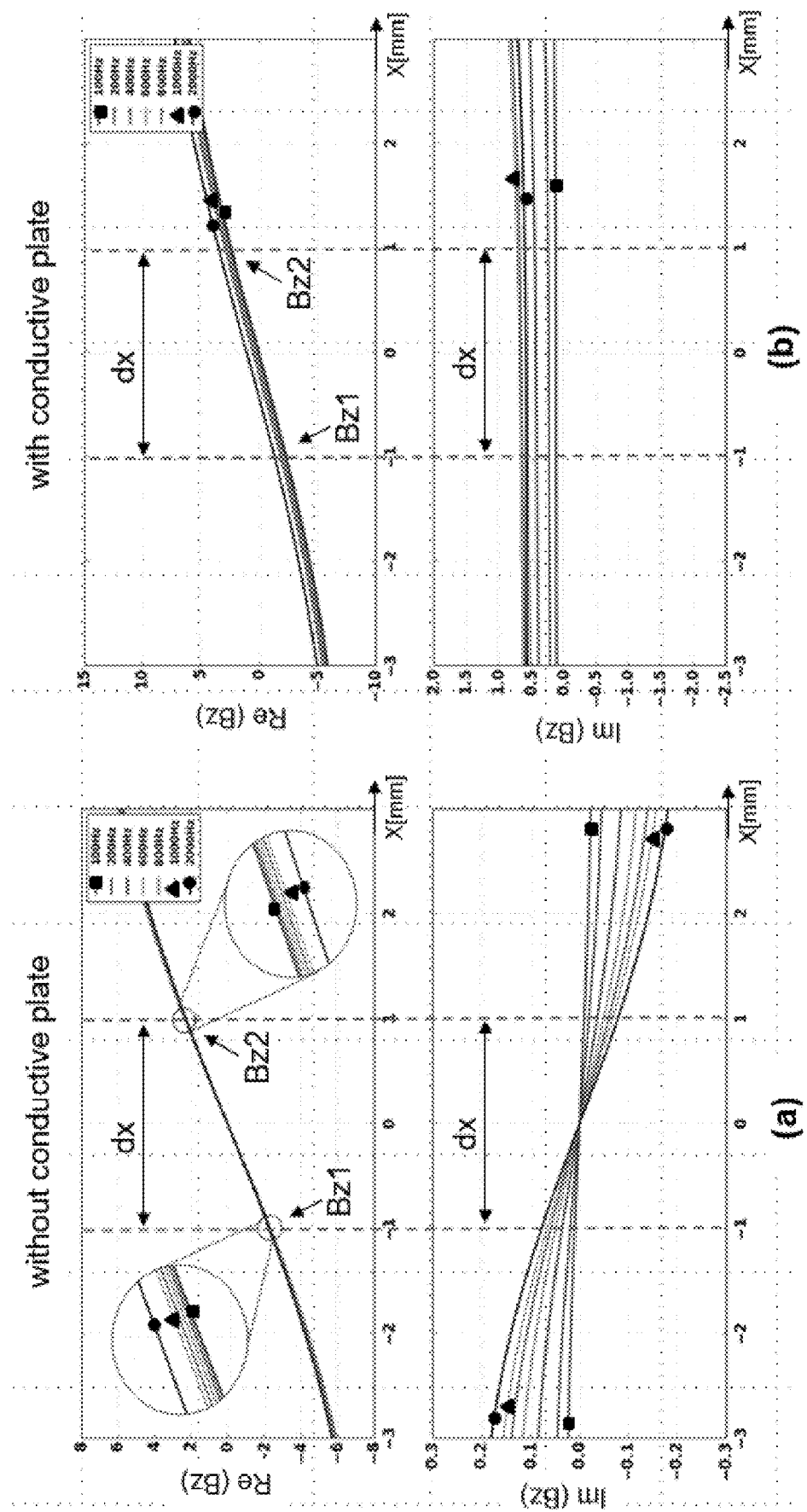
FIG. 2(a) shows simulation results of an amplitude and a phase of a complex representation of a magnetic field component Bx, of a magnetic field induced by a sinusoidal AC current for various frequencies, at various locations on the X-axis, as can be measured by the sensor elements of the sensor device of FIG. 1(a) to FIG. 1(d), if the metal plate would be absent.
FIG. 2(b) shows simulation results, in the presence of the metal plate.

FIG. 2(a) shows simulation results of an amplitude and a phase of a complex representation of a magnetic field component Bz of a magnetic field induced by a sinusoidal AC current of various frequencies, as a function along the X-axis, as can be measured at various locations on the X-axis. The vertical lines indicate the values measured by the sensor elements H1, H2 of the sensor device 102 of FIG. 1(d), if the metal plate 103 would be absent. The simulation was done for a sensor system with the following parameters: (busbar:) Wc=18 mm, Tc=3 mm, Ws=9 mm; (metal plate:) Tp=5 mm, Lp=Wp=5 to 10 cm, g=75 mm; but of course, the present invention is not limited hereto, and other dimensions can also be used.

As can be seen, the real part of Bz1 and Bz2 are frequency dependent: the curve with the square (corresponding to a 100 Hz current) does not coincide with the curve with the triangle (corresponding to a 1000 Hz signal) and does not coincide with the curve with the square (corresponding to a 2000 Hz signal). And also the difference between the real part of Bz1 and the real part Bz2 is frequency dependent, because the difference between the two curves with the circle is different from the difference between the two curves with the squares. Likewise, the imaginary parts of Bz1 and Bz2 are frequency dependent, and also the difference between the imaginary parts is frequency dependent.

FIG. 2(b) shows simulation results in the presence of the metal plate 103. As can be seen, the individual signals Bz1 and Bz2 are still individually dependent on frequency, but the difference between the real part of Bz1 and the real part of Bz2 is substantially independent of frequency. This difference is only dependent on the magnitude of the AC current.

As can further be seen, while the individual imaginary parts vary with frequency, the imaginary part of Bz1 and the imaginary part of Bz2 are substantially equal, hence the difference between them is substantially equal to zero, irrespective of the frequency. In other words, the phase shift between Bz1 and Bz2 is zero. It follows that the magnitude of $\Delta Bz=(Bz1-Bz2)$ is proportional to the magnitude of the AC current according to the formula: $I=K*(Bz1-Bz2)$, where K is a constant, independent of the frequency content of the current waveform, for frequencies in the range from DC to about 2000 Hz. As far as is known to the inventors, this teaching is not known in the prior art.

It can also be appreciated from FIG. 2(b) that the x1 and x2 position of the two Hall sensor elements is not at all critical, and also that the distance "dx" between the two Hall sensor elements is not at all critical, and that the position of the sensor device 102 inside the gap (along the X-axis) between the two conductor portions 101a, 101b is not at all critical.

The skilled person having the benefit of the present disclosure can easily find an optimal position for the sensor device 102 for a given busbar (Wc, Tc, Ws) and for a given metal plate (Lp, Wp, Tp) and for a given distance (g) between them, by moving the sensor device 102 closer to or further from the metal plate, and by performing a set of measurements for AC currents of various frequencies, and by selecting the position yielding the most accurate results. (This paragraph is further referred to herein as the "first optimization method").

Alternatively, for a given position of the sensor device, the skilled person may find an optimal distance "g" between the busbar and the metal plate, by moving the metal plate 103 closer to or further from the sensor device (and the busbar), and by performing a set of measurements for AC currents of various frequencies, and by selecting the position yielding the most accurate results. (This paragraph is further referred to herein as the "second optimization method").

For a given busbar and for a given metal plate, an overall optimum arrangement may be found for example by starting from an initial position of the sensor device 102 (e.g. in the middle between the two electrical conductor portions and at half their height Tc/2) and an initial distance "g" between the busbar and the metal plate (e.g. about 75 mm), and by alternatingly repeating the methods described in the two previous paragraphs, until a desired accuracy is found. If the result is not satisfactory, this process can be repeated or another busbar and/or another metal plate. (This paragraph is further referred to herein as the "overall optimization method").

Figures 3A, 3B:
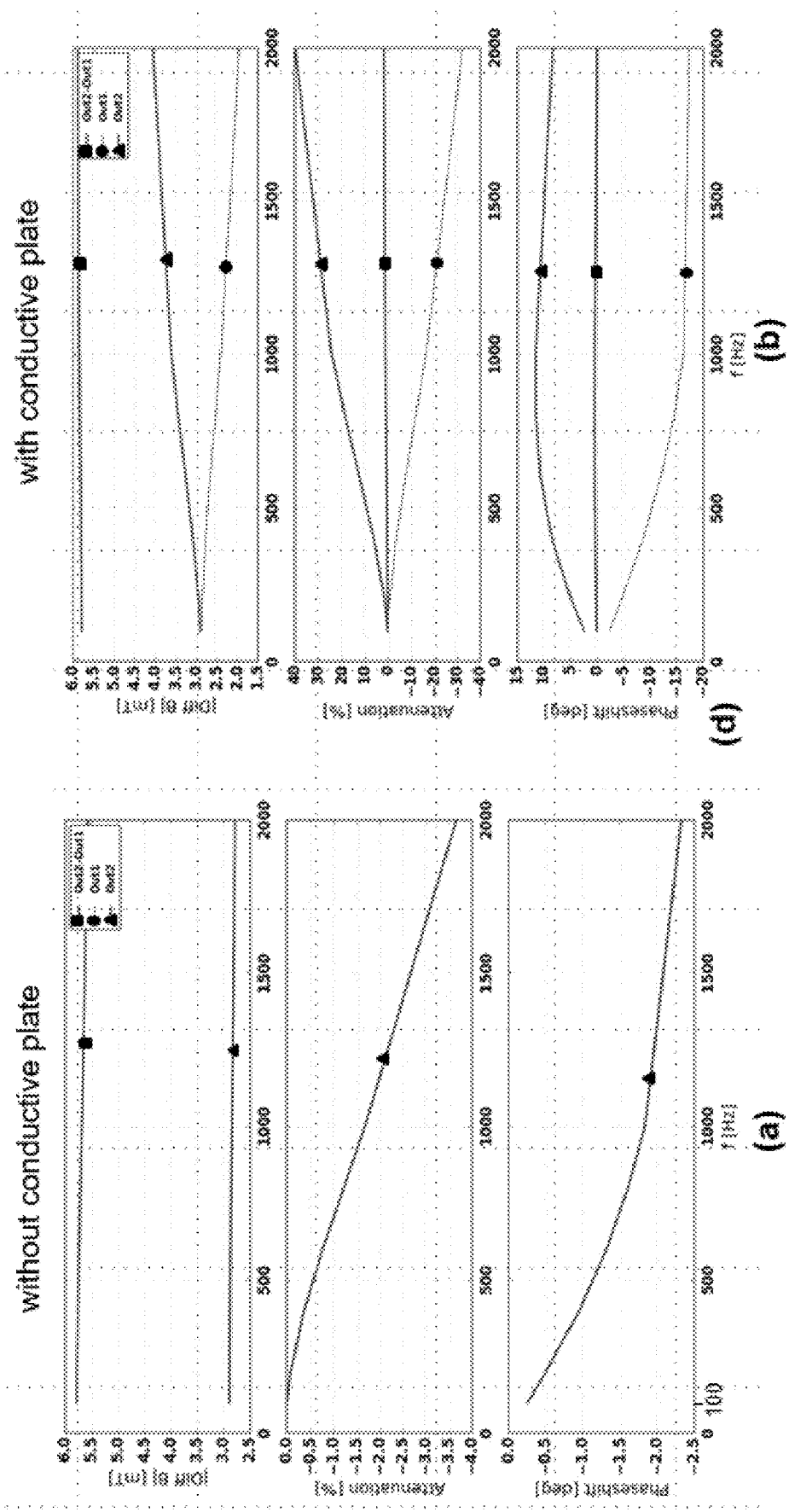
FIG. 3(a) illustrates how the signals measured by the sensor elements of FIG. 1(a) to FIG. 1(d) would be attenuated and phase shifted as a function of frequency, in the absence of the metal plate.
FIG. 3(b) illustrates how the signals measured by the sensor elements of FIG. 1(a) to FIG. 1(d) would be attenuated and phase shifted as a function of frequency, in the presence of a metal plate. As can be seen, the difference or gradient signal has a substantially constant amplitude and the phase-shift is substantially equal to zero, irrespective of the frequency of the AC current (at least for frequencies from about 100 Hz to about 2000 Hz).

FIG. 3(a) illustrates how the signals measured by the sensor elements of FIG. 1(a) to FIG. 1(d) would be attenuated and phase shifted as a function of frequency, in the absence of the metal plate 103. The upper graph shows the amplitude of the individual signals (equal to about 3 mT in the example), and the amplitude of the difference signal (equal to about 6 mT in the example). The graph in the middle shows the attenuation in %, and the lower graph shows the phase shift in degrees relative to an AC current having a frequency of 100 Hz. As can be seen, in this particular example, the magnetic field caused by an AC current having a frequency of 2000 Hz will be attenuated by approximately 3.7% and phase shifted by approximately −2° with respect to an AC current having the same amplitude but a frequency of 100 Hz. In other examples (not shown), the attenuation may be about 6% and the phase shift may be about 3°

FIG. 3(b) illustrates how the individual signals measured by the sensor elements of FIG. 1(a) to FIG. 1(d) would be attenuated and phase shifted as a function of frequency, in the presence of the metal plate 103, and illustrates the difference of these signals.

As can be seen, the difference or gradient signal (indicated with a square) has a constant amplitude (see horizontal line with a square in the central graph) and has a zero phase-shift (see horizontal line with a square in the lower graph), irrespective of the frequency of the AC current.

It is simply amazing that by adding a metal plate, or another conductive surface in the vicinity of the busbar, and by measuring a magnetic field component at two locations x1, x2 spaced apart by a distance dx inside the gap between the two conductor portions 101a, 101b, and by calculating a magnetic field difference or spatial gradient, the negative influence of the skin effect can be completely nulled. This current sensor device 102 can determine the instantaneous magnitude of the AC current having one or more frequencies up to 2000 Hz, by simply measuring the gradient, and by multiplying it with a predefined constant "K", without having to perform frequency analysis, e.g. Fourier analysis, or time-domain analysis to determine the shape of the waveform.

When combining the "first, second and overall optimization method" described above, and the simulation results of FIG. 2 and FIG. 3, the skilled person having the benefit of the present disclosure will now understand that he only needs to compare the measurement of a 100 Hz sinusoidal current and a 2000 Hz sinusoidal current of the same amplitude, and if these results are substantially the same, then the result will also be the same for intermediate frequencies. This can significantly simplify the method(s) of finding suitable or semi-optimal or optimal locations.

Figure 4A:
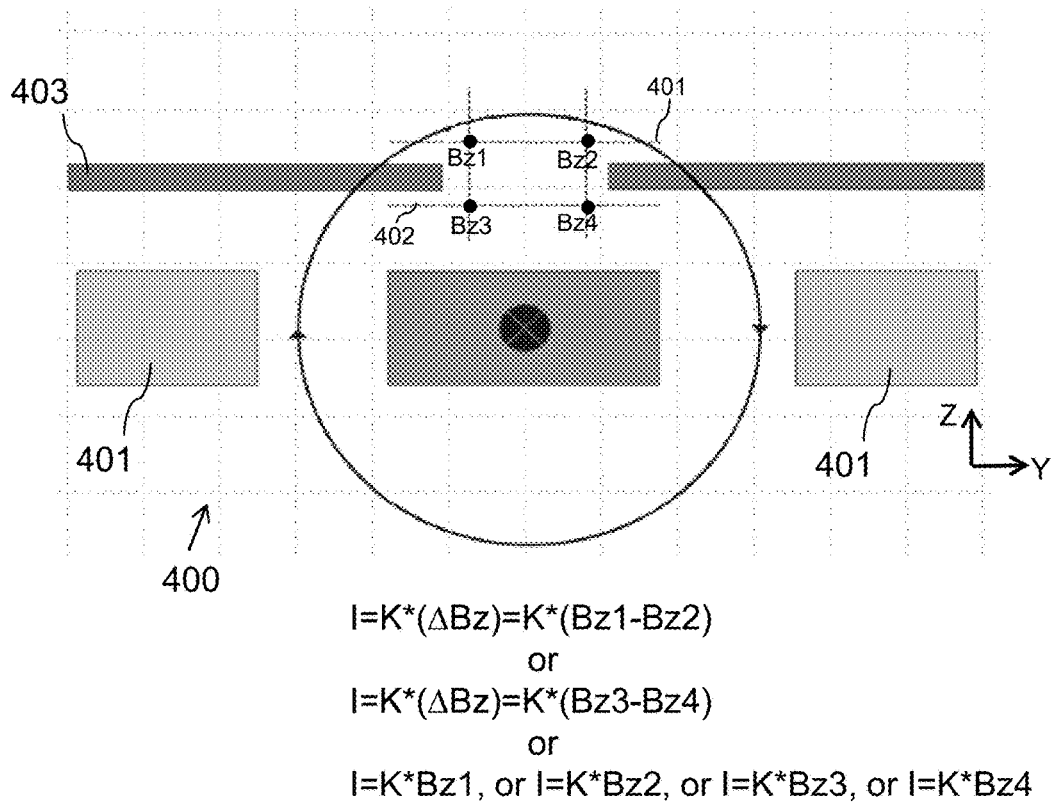
FIG. 4(a) to FIG. 4(h), illustrate a second embodiment of a current sensor system according to the present invention, and variants thereof, wherein the current sensor system comprises an elongated electrical conductor (e.g. a busbar) having two transversal cut-outs, spaced apart from each other in the overall longitudinal direction of the busbar, so as to form a zig-zag with a transverse passage zone, and further comprises a magnetic sensor device arranged in the vicinity of said passage zone, and a metal plate with an opening also arranged in the vicinity of the passage zone.
Figure 4B:
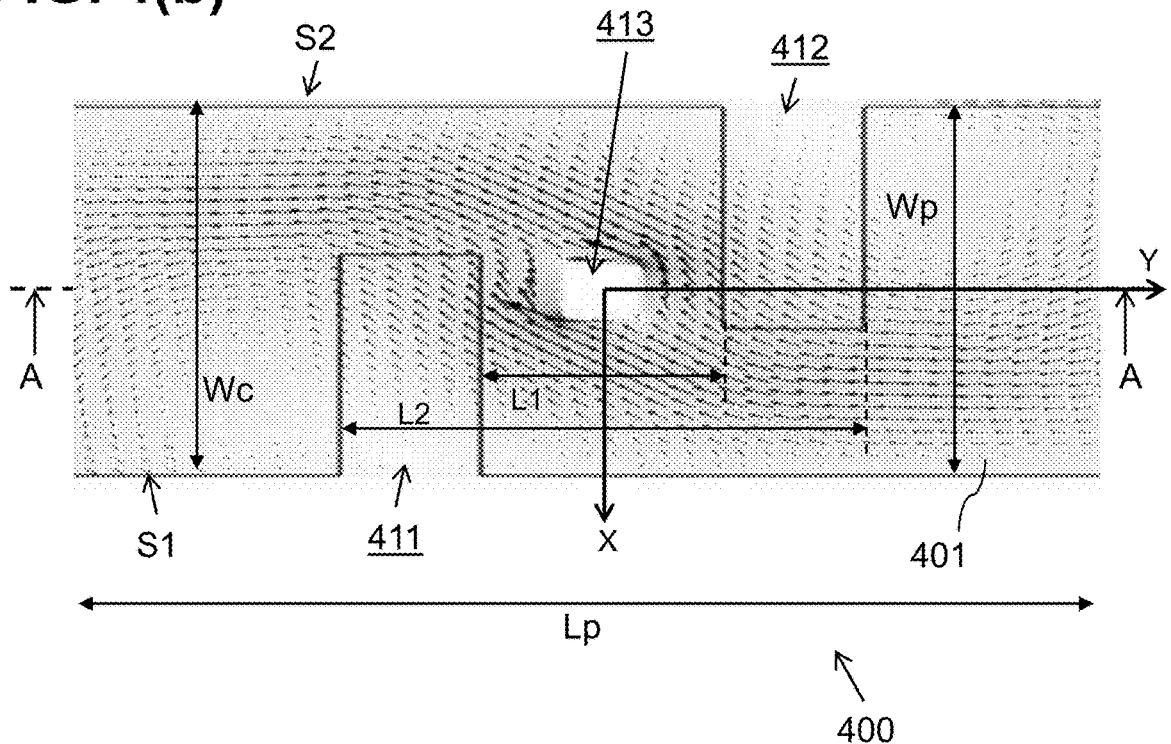
Figure 4C:
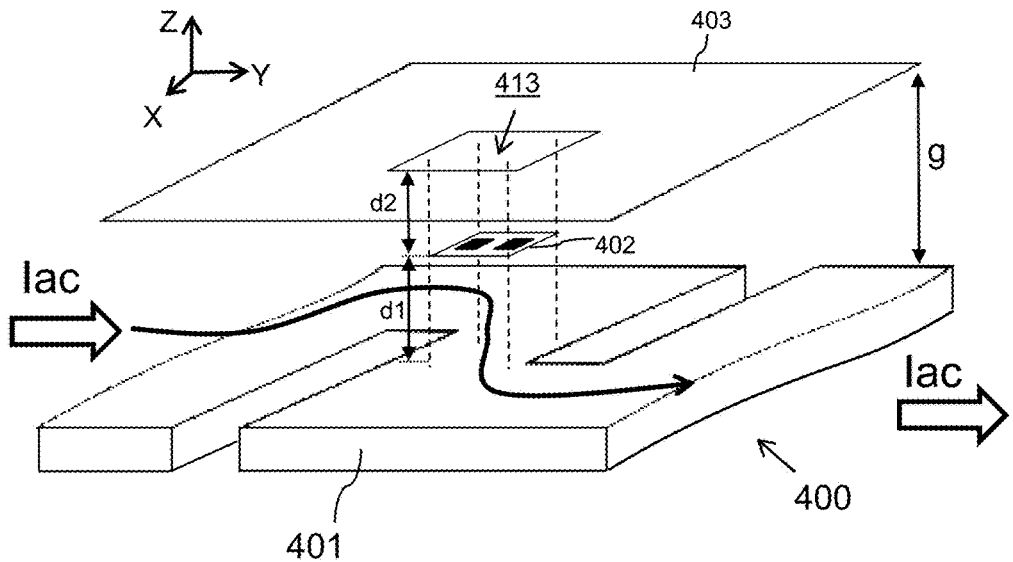
Figure 4D:
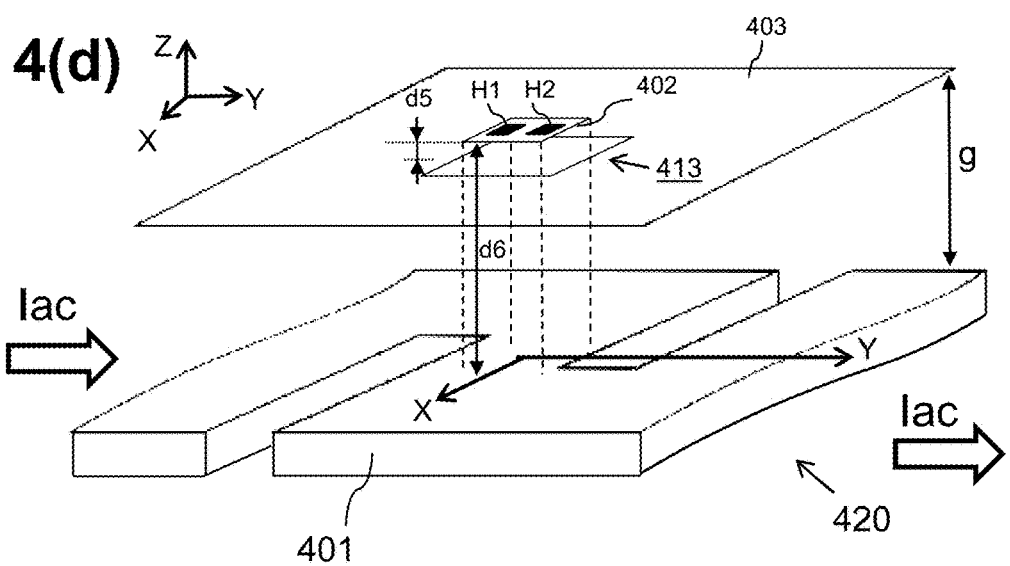
Figure 4E:
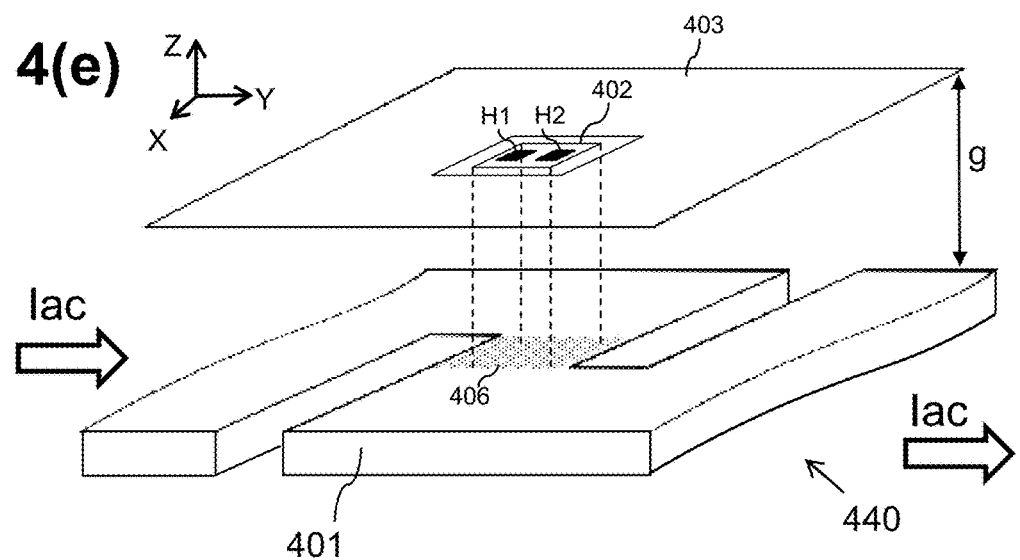
Figure 4F:
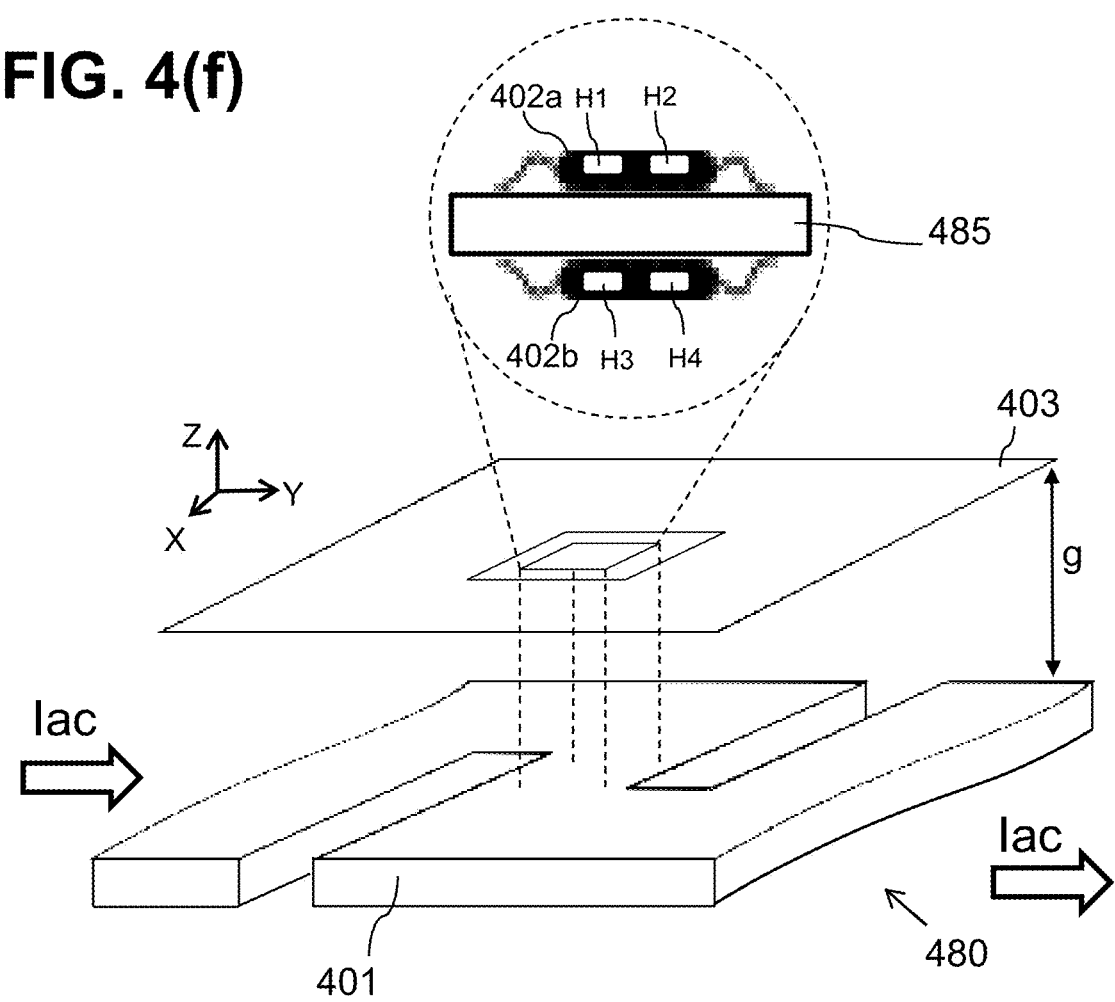

FIG. 4(a) to FIG. 4(h) illustrate a second embodiment of a current sensor system according to the present invention, and variants thereof, wherein the current sensor system comprises: an electrical conductor 401 (e.g. a busbar) extending mainly in a first direction Y, and having two transversal cut-outs 411, 412 (extending in the X-direction from opposite sides S1, S2 of the busbar), the cut-outs being spaced apart from each other along the longitudinal direction Y, so as to form a zig-zag with a transverse passage zone 406 between the two cut-outs (see e.g. FIG. 4(e)); a magnetic sensor device 402 arranged in the vicinity of said passage zone; a metal plate 403 having an opening 413, said metal plate also being arranged in the vicinity of the passage zone, at a distance "g" in the Z-direction from the busbar.

Instead of a metal plate with an opening, it is also possible to use an object having a surface or layer, a portion of which surface or layer is electrically non-conductive, said non-conductive surface or layer portion being surrounded by an electrically conductive surface or layer portion.

In the embodiments of FIG. 4(c) to FIG. 4(e) the sensor device 402 has a semiconductor substrate oriented parallel with the XY-plane of the electrical conductor 401 (perpendicular to the thickness direction Z of the electrical conductor), and parallel to the metal plate 403. The height position (in the Z-direction) of the sensor device 402 may vary between a position near the busbar (see e.g. FIG. 4(c)) to a position near the metal plate (see e.g. FIG. 4(e)), or even beyond the metal plate (see FIG. 4(d)). The sensor device 402 may comprise two horizontal Hall elements H1, H2, each configured for measuring a magnetic field component oriented in the Z-direction, referred to herein as Bz1, Bz2 respectively.

FIG. 4(b) illustrates how eddy currents will flow in a plate (shown in overlay over the busbar) with an opening 413 "above" the passage zone or the center of the zig-zag. In the example of FIG. 4(b), the plate has a width Wp substantially equal to the width We of the electrical conductor, but that is not absolutely required for the invention to work. As described above for the first embodiment, also in the second embodiment, the shape and the dimensions of the metal plate are not critical. Preferably the plate has a width Wp (measured in the transverse direction X) in the range from about 50% to about 300% of the width We of the electrical conductor, or from about 50% to about 200% of Wc, e.g. about 100% of Wc, or about 150% of Wc.

In the example of FIG. 4(b), the length of the metal plate Lp (measured in the Y-direction) extends further than the positions of the two cut-outs or slits 411, 412, but also the length Lp of the metal plate 401 is not critical, provided it is sufficiently long, for example at least equal to or longer than the length L2 between the distal edges of the cut-outs 411, 412.

FIG. 4(a) is a schematic cross-sectional view of FIG. 4(b) in the plane A-A. Four sensor locations are indicated (each by a black dot), but it suffices to measure for example only Bz1 and Bz2 "above the plate", or only Bz3 and Bz4 "below the plate", or to measure two magnetic field components "at the same height as the plate" (e.g. as shown in FIG. 4(e)).

In all of these cases, the magnitude of the AC current can be determined in accordance with the formula: $I=K1*(dBz/dy)$, or if the value of dy and K1 are combined, in accordance with the formula:

$I=K*\Delta Bz=K*(Bz1-Bz2)$, or $I=K*(Bz3-Bz4)$. The value of K is a constant, independent of the frequency. The value of K may be determined in known manners, e.g. during an end-of-line test, or a calibration-test, and may be stored in a non-volatile memory 931, 1031 of the sensor device.

In a variant, illustrated in FIG. 4(f), the sensor system 480 comprises two sensor devices 402a, 402b mounted on opposite sides of a substrate, e.g. a printed circuit board 485. The first sensor device 402a is configured for measuring Bz1 and Bz2 at a first height position (e.g. above the metal plate 403) and to determine a first current value I1, the second sensor device 402b is configured for measuring Bz3 and Bz4 at a second height position (e.g. at the same height of the plate 403 or below the plate 403), and to determine a second current value I2. The two current values I1, I2 may be compared, e.g. by one of the sensor devices, or by an external processing unit (e.g. an ECU), for redundancy or functional safety purposes. If the two values I1, I2 are more or less the same within a predefined tolerance margin, the two current values can also be averaged, which further improves the accuracy. If the two current values deviate more than said predefined tolerance margin, that is an indication of a fault-condition.

In another variant (not shown), the current sensor system comprises a single sensor device having two semiconductor dies, stacked on top of each other, a first die configured for measuring Bz1 and Bz2 at a first distance from the busbar, the second die configured for measuring Bz3 and Bz4 at a second distance from the busbar. The semiconductor dies may but need not have the same size. In a particular embodiment, the lower die may have two horizontal Hall elements H3, H4 spaced apart by a distance dy1, and the upper die may have two horizontal Hall element H1, H2 spaced by a distance dy2 smaller than dy1, and the first and second die may be interconnected by means of bond wires connected to bond pads located at an upper surface of both dies.

Figure 4G:
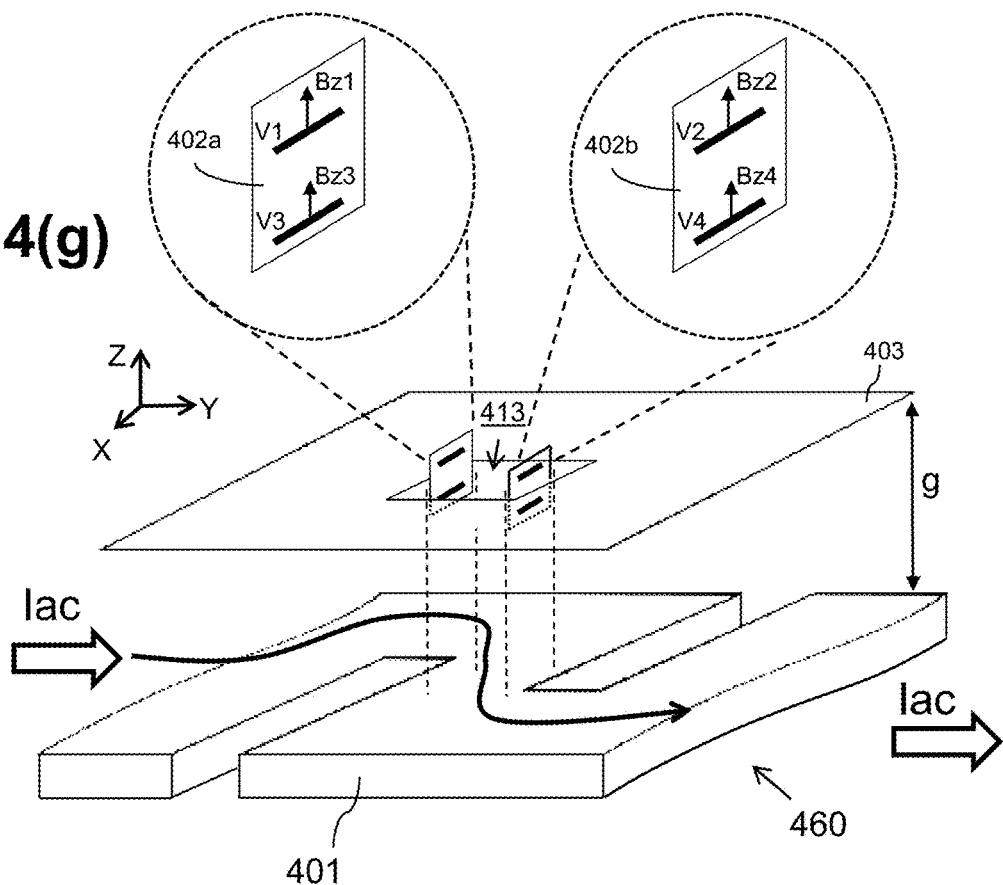
Figure 4H:
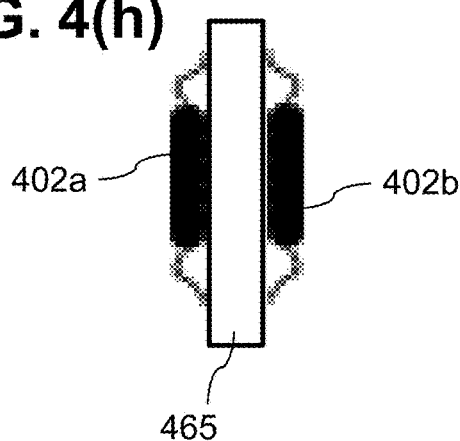

In the example of FIG. 4(g), the sensor system 460 comprises two sensor devices 402a, 402b, spaced apart along the Y-axis, and oriented such that their semiconductor substrates are perpendicular to the Y-axis of the busbar, and thus also perpendicular to the metal plate 403. The first sensor device 402a may comprise two vertical Hall elements V1, V3 for measuring Bz1, Bz3, one of which may be located above the metal plate 403, the other at the same height as, or below the metal plate. Likewise, the second sensor device 402b may comprise two vertical Hall elements V2, V4 for measuring Bz2, Bz4, one of which may be located above the metal plate 403, the other at the same height as, or below the metal plate. A processing unit, e.g. a processing unit of one of the sensor devices, or an external processing unit (e.g. an ECU) can then calculate a first current I1, for example based on Bz1 and Bz2, and a second current I2, for example based on Bz3 and Bz4, for redundancy purposes. The two sensor devices 402a, 402b may be mounted on opposite sides of a printed circuit board (PCB) 465, as shown in FIG. 4(h).

In a variant of FIG. 4(g), each sensor device contains only one sensor element, for example sensor device 402a contains only vertical Hall element V1, and sensor device 402b contains only vertical Hall element V2. The same formulas for calculating the AC current can be used, but of course, in this case, there is no redundancy.

A specific example of a current sensor system as shown in FIG. 4(e) was simulated, having the following parameters: (busbar:) Wc=18 mm, Tc=3 mm, L1=6 mm, L2=16 mm, square opening=2 mm×2 mm; (metal plate:) Wp=40 mm, Lp=40 mm, Tp=105 µm, g=0.5 mm, but of course, the present invention is not limited to systems with these particular dimensions.

Figure 5A:
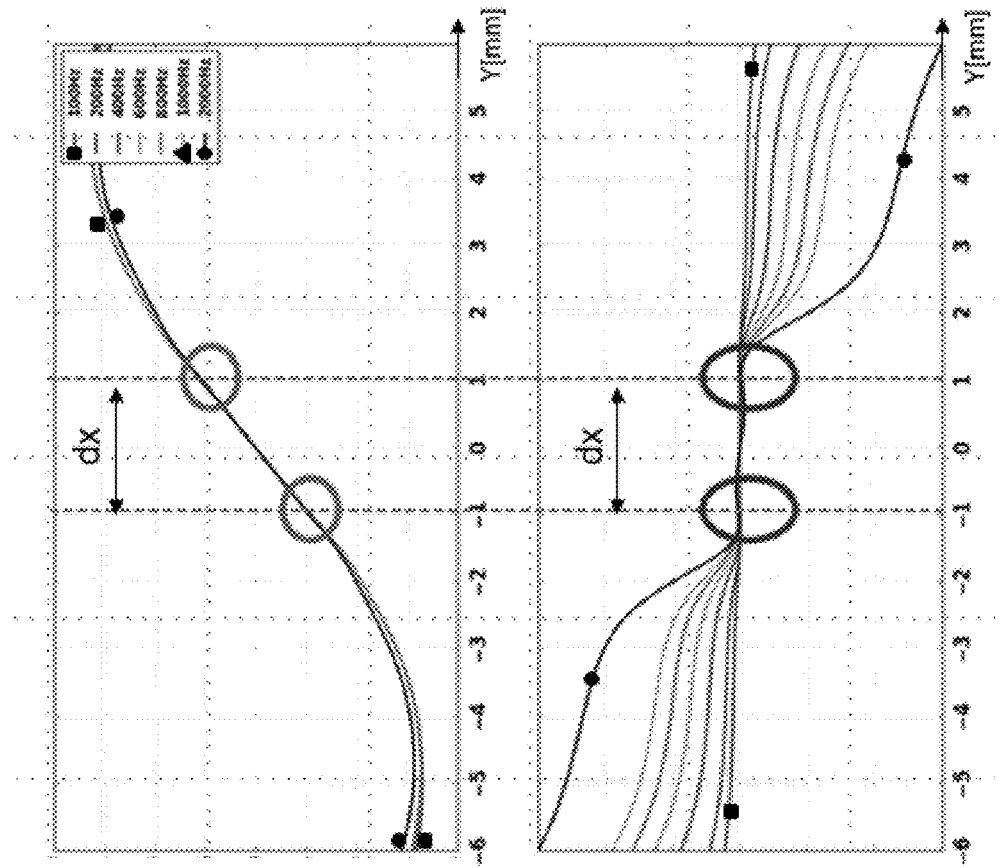
FIG. 5(a) show simulation results of the Real and Imaginary part of a complex representation of the magnetic field component Bz of the magnetic field induced by a sinusoidal AC current for various frequencies, at various locations on the longitudinal Y-axis, as can be measured by the sensor elements of the sensor device of FIG. 4, if the metal plate would be absent.

FIG. 5(a) show simulation results of the Real and Imaginary part of a complex representation of the magnetic field component Bz of the magnetic field induced by a sinusoidal AC current for various frequencies, at various locations along the Y-axis, as can be measured by the sensor elements of the sensor device of FIG. 4(e), if the metal plate 403 would be absent.

These graphs are similar to the graphs of FIG. 2, for positions in the vicinity of the "passage zone" and in the vicinity of the opening 413 in the metal plate 403. The vertical lines in FIG. 5(a) indicate the positions of the sensor elements H1 and H2 (of FIG. 4c to FIG. 4e) which in the example are 2.0 mm apart, or of the sensor elements V1, V2 (of FIG. 4g).

As can be seen, the real part of Bz1 and Bz2 are slightly frequency dependent: the curve with the square (corresponding to a 100 Hz current) does not coincide with the curve with the circle (corresponding to a 2000 Hz signal). Thus, also the difference between the real part of Bz1 and the real part Bz2 is frequency dependent. But as can also be seen, the imaginary parts of Bz1 and Bz2 are much more frequency dependent, thus also the difference between the imaginary parts is frequency dependent. If a magnitude of the current would be calculated based on these component values or based on a difference or gradient of these component values, the measurement would be inaccurate.

Figure 5B:
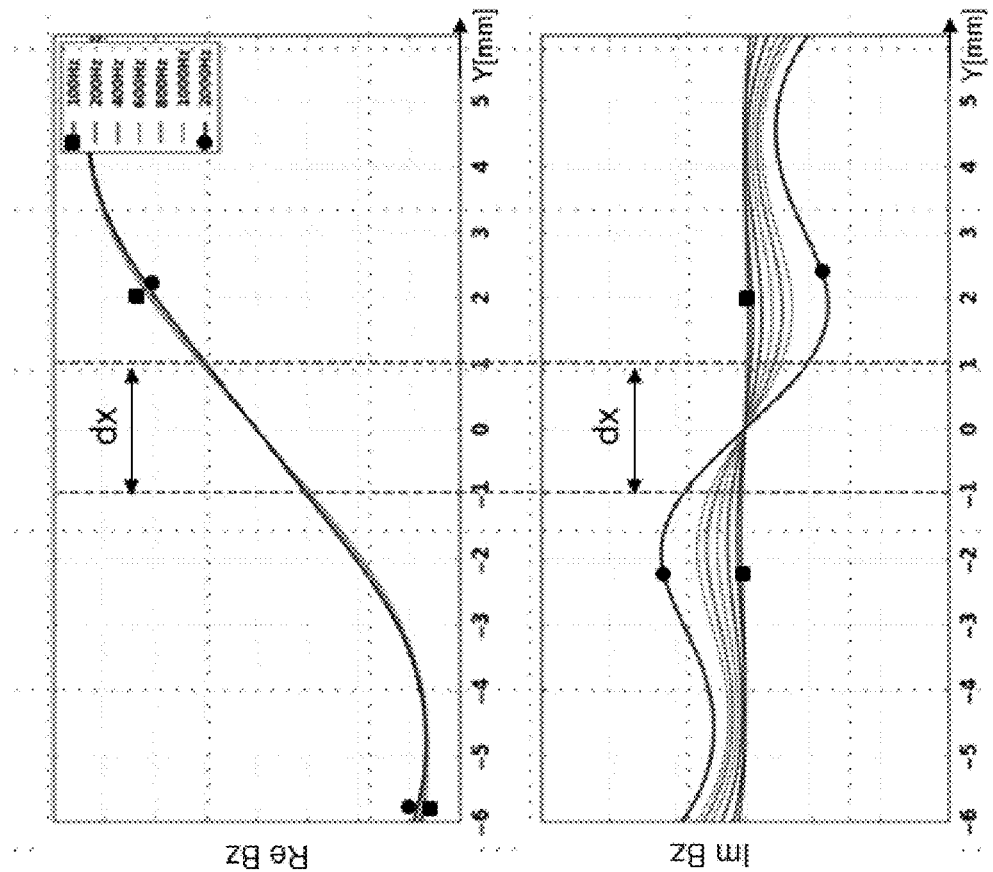
FIG. 5(b) show simulation results, in the presence of the metal plate.

FIG. 5(b) shows simulation results in the presence of the metal plate 403 with the opening 413. As can be seen, the real and imaginary parts of the individual signals Bz1 and Bz2 are not dependent on frequency, because the curves substantially coincide at the measurement's locations, but only dependent on the magnitude of the AC current. Hence, also the difference between the real part of Bz1 and the real part of Bz2 is substantially independent of frequency. Furthermore, the imaginary part of Bz1 and the imaginary part of Bz2 are substantially equal to zero, irrespective of the frequency. Thus, also the phase shift between Bz1 and Bz2 is zero. It follows that the magnitude of $\Delta Bz=(Bz1-Bz2)$ is proportional to the magnitude of the AC current, according to the formula: $I=K*(Bz1-Bz2)$, where K is a constant, independent of the frequency content of the current waveform, for frequencies in the range from DC to about 2000 Hz. As far as is known to the inventors, this behaviour is not known in the prior art.

It can also be appreciated from FIG. 5(b) that the x1 and x2 position of the two Hall sensors is not critical and may slightly shift, and that the distance "dx" between the two Hall sensors is also not critical. Preferably the opening 413 has a square or rectangular shape, with a length and a width of about 90% to about 150% of the distance between the sensor elements dx, but another shape may also work, for example circular, elliptical, hexagonal, octagonal, polygonal, etc.

Since the imaginary parts of Bz1 and Bz2 are equal to zero, the current can also be calculated in accordance with the following formula: $I=K*Bz1$, or $I=K*Bz2$. Such an embodiments requires only one sensor device having only one magnetic sensor element. However, such a current sensor system is not robust against an external disturbance field (fremdfeld), whereas current sensor systems which determine the current as a function of the magnetic field difference or gradient are substantially "strayfield-immune".

FIG. 6(a) to FIG. 6(g) illustrate a third embodiment of a current sensor system 600 according to the present invention, wherein the current sensor system comprises an elongated electrical conductor 601 (e.g. a busbar) having two transversal cut-outs, spaced apart from each other in the longitudinal direction (Y), so as to form a zig-zag with a transverse passage zone, and a magnetic sensor device 602 arranged in the vicinity of said passage zone, and a metal plate 603 having an edge (e.g. a straight edge oriented in a transverse direction X of the busbar) arranged asymmetrically in the vicinity of the passage zone, and preferably extending over the entire width Wc of the electrical conductor 601. This embodiment can be seen as a variant of the embodiment of FIG. 4, the main difference being that the metal plate 603 or the object with an electrically conducting surface of FIG. 6 is located on only one side of the "passage zone" rather than on both sides, as was the case in FIG. 4. Most of what is described above for the second embodiment and its variants (FIG. 4) is also applicable in the third embodiments (FIG. 6), unless explicitly mentioned otherwise or clear from the context.

FIG. 6(b) shows the electrical conductor 601 in top view. The electrical conductor 601 may be identical to the electrical conductor 401 shown in FIG. 4.

Figure 6A:
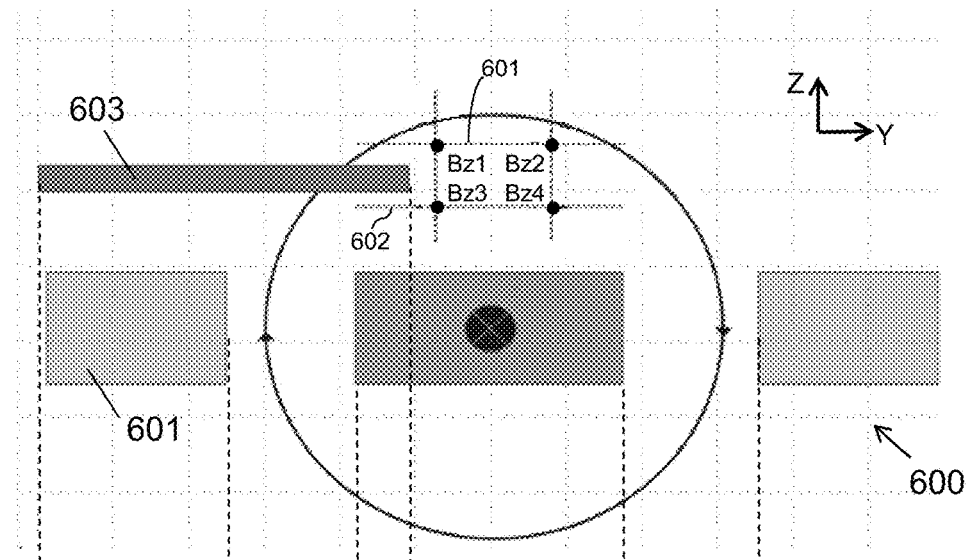
FIG. 6(a) to FIG. 6(g), illustrate a third embodiment of a current sensor system according to the present invention, wherein the current sensor system comprises an elongated electrical conductor (e.g. a busbar) having two transversal cut-outs, spaced apart from each other in the longitudinal direction, so as to form a zig-zag with a transverse passage zone, and a magnetic sensor device arranged in the vicinity of said passage zone, and a metal plate having an edge arranged asymmetrically in the vicinity of the passage zone.
Figure 6B:
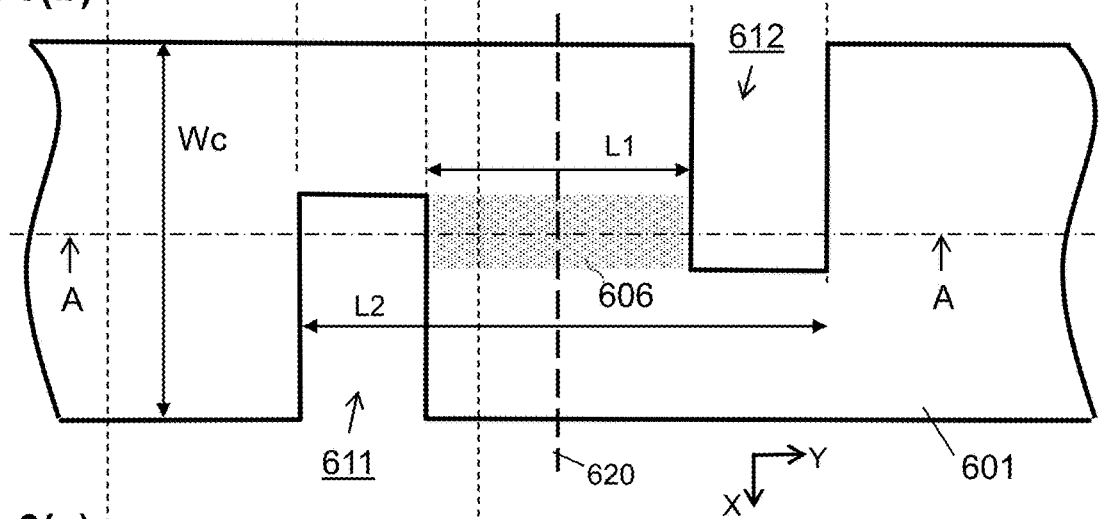
Figure 6C:
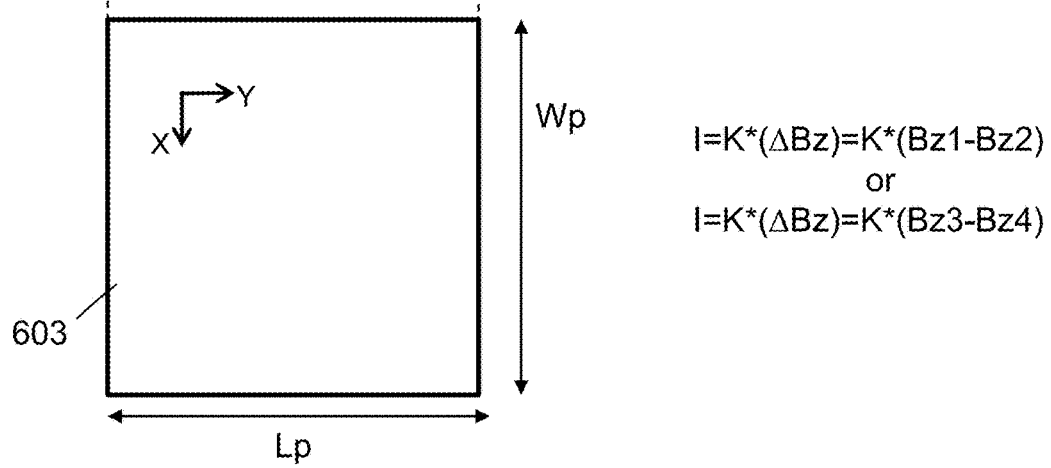
Figure 6D:
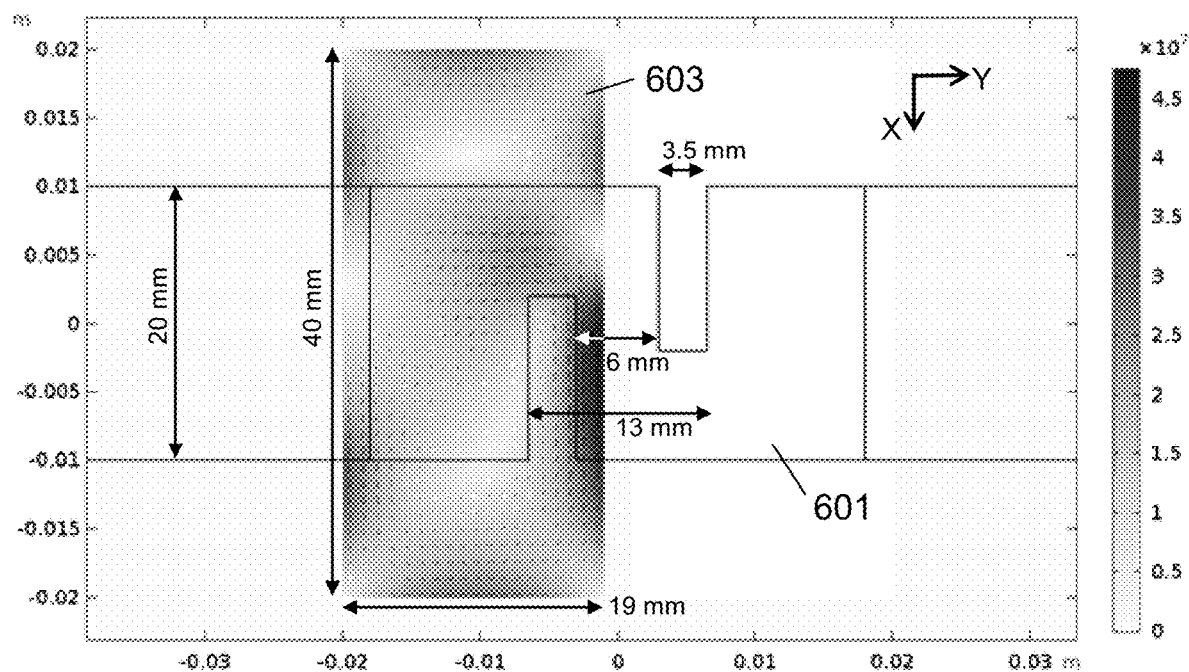
Figure 6E:
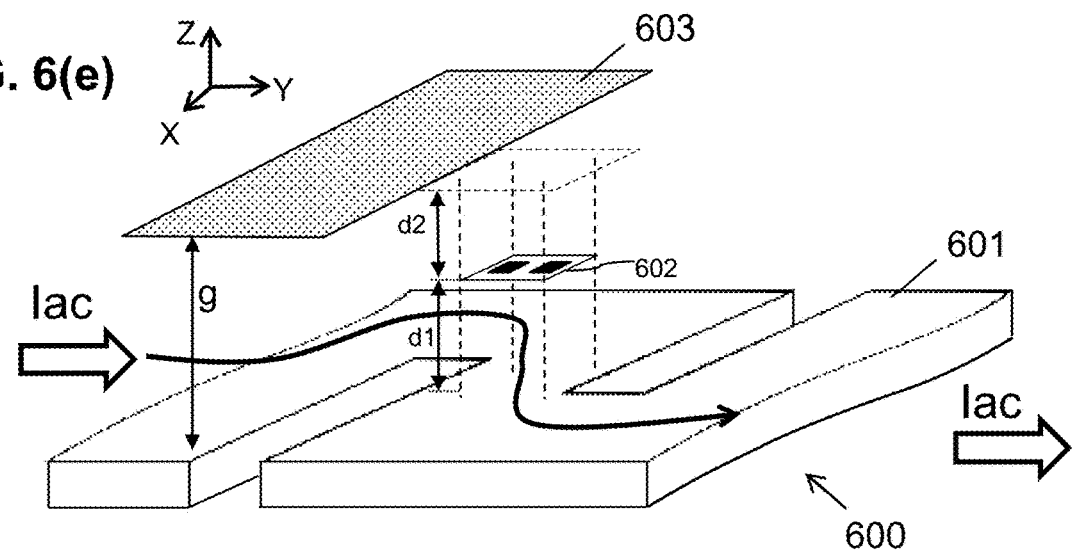
Figure 6F:
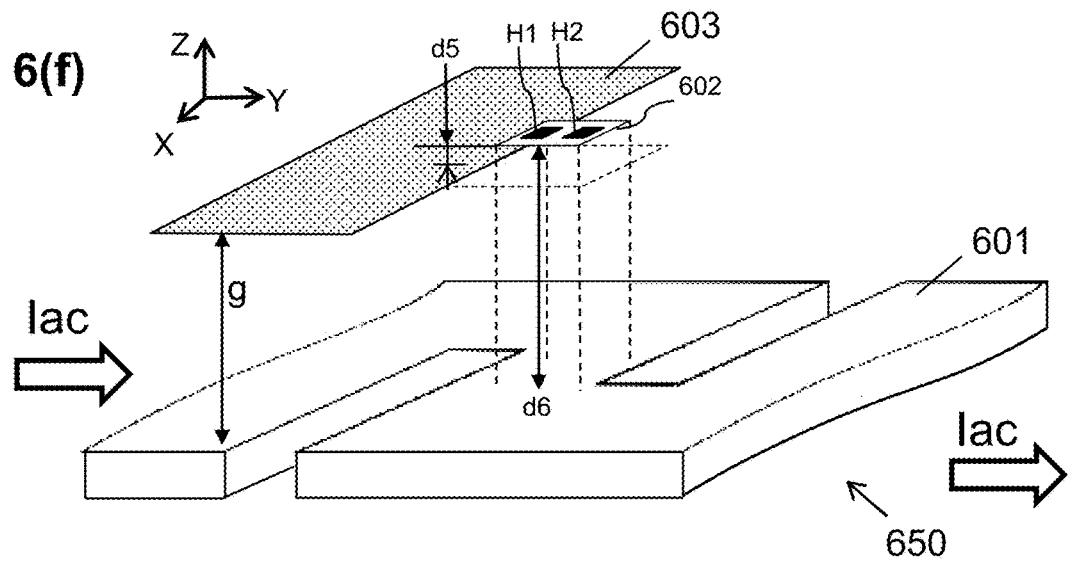
Figure 6G:
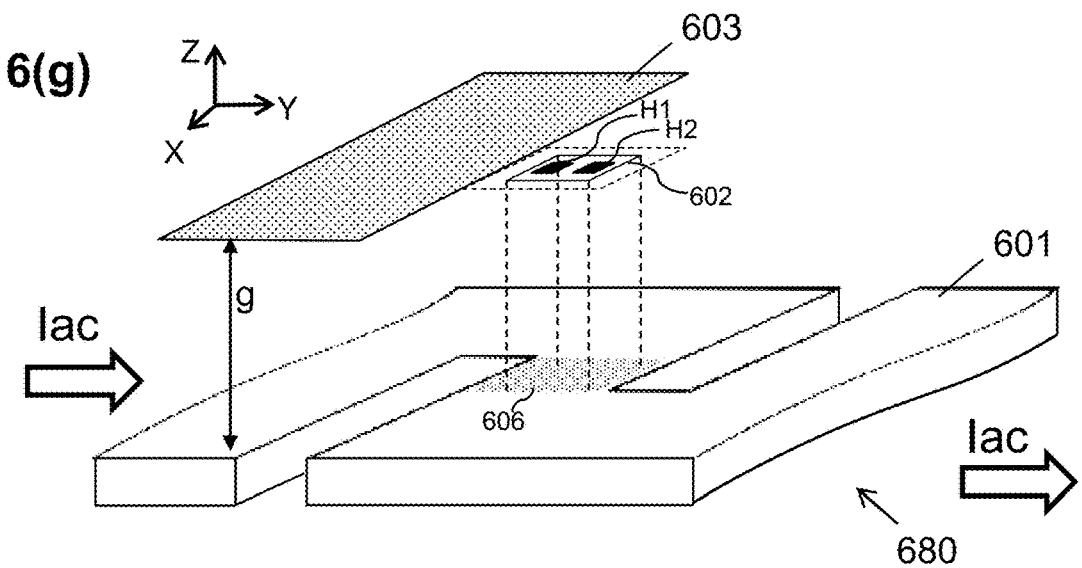

FIG. 6(a) shows a cross section of FIG. 6(b) according to A-A;

FIG. 6(e) to FIG. 6(g) show a perspective view, similar to FIG. 4(c) to FIG. 4(e), but using a metal plate located asymmetrically or eccentrically with respect to the "transverse passage zone".

FIG. 6(c) shows an example of a rectangular metal plate, which can be used in this embodiment. The width Wp of this plate is preferably equal to the width Wc of the electrical conductor (e.g. busbar), but that is not absolutely required, and Wp may also be larger than the width Wc of the conductor, or even slightly smaller. For example, Wp may be 50% to 300% of Wc. This value is not critical. The length Lp of the plate (in the longitudinal direction Y of the busbar) is also not critical. Preferably the length Lp is sufficiently long, e.g. at least as long as the length L1 between the proximal edges of the slits or cut-outs 611, 612, or at least the length L2 between the distal edges of the slits or cut-outs 611, 612, or at least 150% of L2, or at least 200% of L2. The value of this length is not critical for the invention to work.

FIG. 6(d) shows possible dimensions of such a current sensor system. In the example, the busbar 601 has a width Wc=20 mm, the cut-outs or slits have a width (in the Y-direction) of 3.5 mm and a length of about 12 mm, the distance L1 is 6 mm, the distance L2 is 13 mm, the length of the plate (in the Y-direction) is 19 mm (in this example equal to about L2*150%), and the width Wp of the plate is 40 mm (in this example equal to Wp*2). But of course, this is only an example, and the present invention is not limited to these specific dimensions. FIG. 6(d) also shows an example of eddy currents flowing in such a plate.

FIG. 7 show simulation results for the current sensor system of FIG. 6. The two vertical lines at y1=−1 mm and y2=+1 mm indicate the positions of the two Hall elements H1, H2 along the Y-axis.

Figure 7A:
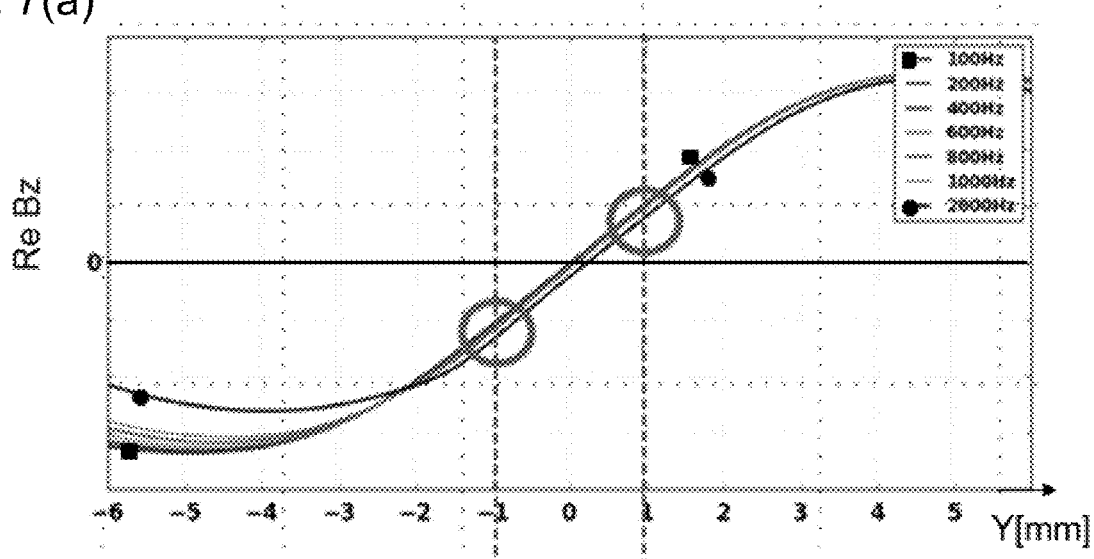
FIG. 7(a) shows the real part of the magnetic field component signal Bz as a function of the position along the longitudinal axis of the busbar for various AC current frequencies.

FIG. 7(a) shows the real part of the magnetic field component signal Bz1, Bz2 (in arbitrary units) as a function of the position along/above the central axis Y of the busbar, for various frequencies of the AC current, ranging from 100 Hz to 2000 Hz. As can be seen, the individual real parts are dependent on the frequency, but the real part of the difference signal ΔBz=(Bz1−Bz2) or of the gradient (ΔBz/dy) is not dependent on frequency.

Figure 7B:
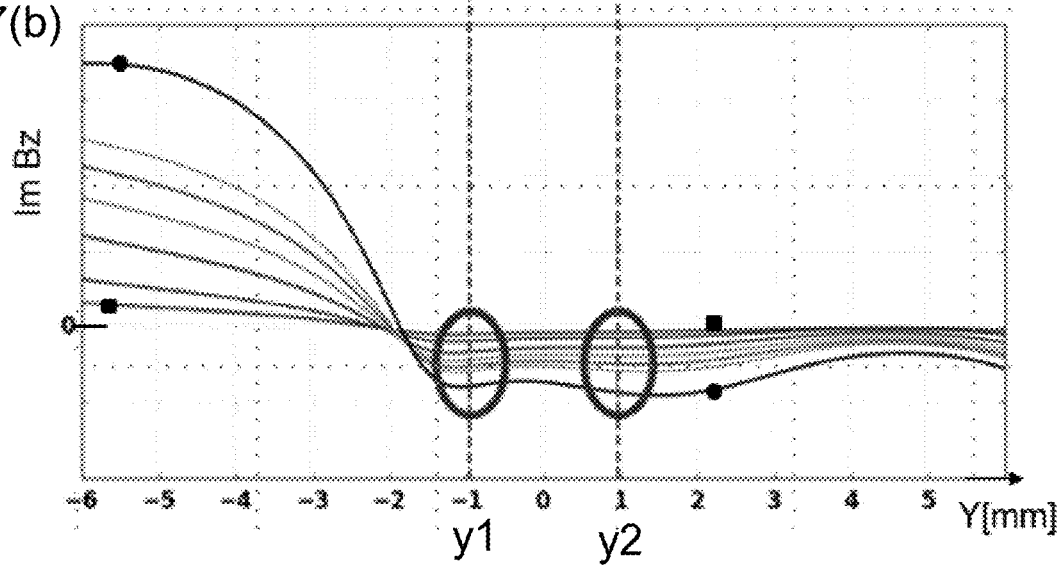
FIG. 7(b) shows the imaginary part of the magnetic field component signal Bz.

FIG. 7(b) shows the Imaginary part of the magnetic field component signal Bz1, Bz2. As can be seen, the individual imaginary parts are dependent on the frequency, but the imaginary part of the difference signal ΔBz=(Bz1−Bz2) or of the gradient (ΔBz/dy) is not, or only marginally dependent on frequency. This result is highly counter-intuitive, because of the asymmetry. As far as is known to the inventors, the prior art does not teach that bringing a metal plate in the vicinity of the busbar, moreover in an asymmetrical position, would improve the accuracy of AC-current measurement by substantially compensating the skin-effect.

Figure 8A:
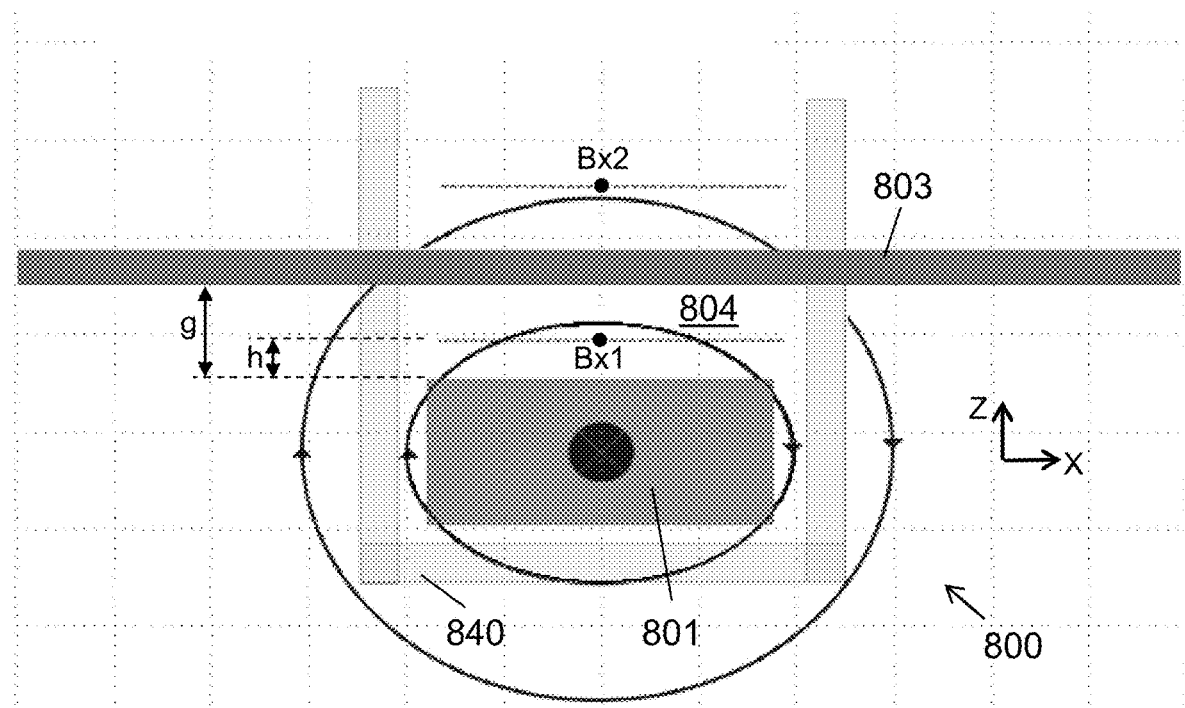
FIG. 8(a) to FIG. 8(c) illustrate a fourth embodiment of a current sensor system according to the present invention, wherein the current sensor system comprises an elongated electrical conductor (e.g. a busbar) with a U-shaped shielding, and a metal plate, and a magnetic sensor device arranged inside the space defined by the metal plate and the shielding.
Figure 8B:
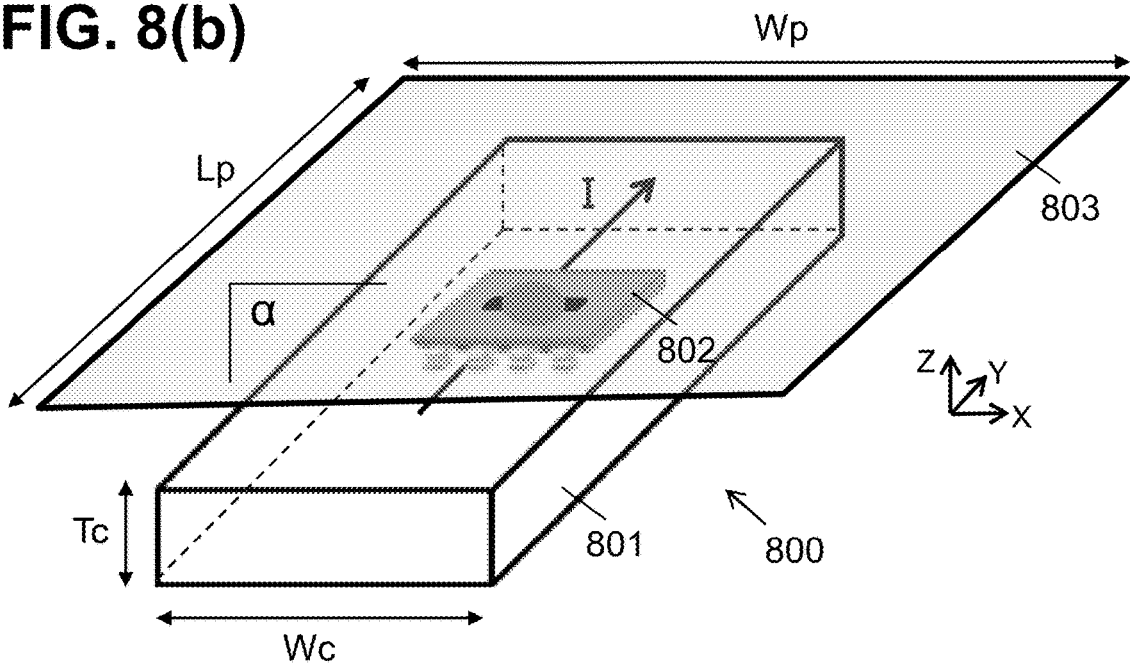
Figure 8C:
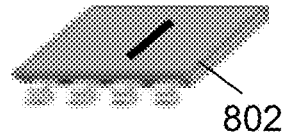

FIG. 8(a) to FIG. 8(c) illustrate a fourth embodiment of a current sensor system according to the present invention, wherein the current sensor system 800 comprises an elongated electrical conductor 801 (e.g. a busbar) with a U-shaped shielding 840, and a conductive plate 803 arranged at a distance "g" from the busbar 801, and a magnetic sensor device 802 (not shown) arranged inside the space defined by or delimited by the metal plate 803 and the shielding 840. As shown, this metal plate 803 does not have an opening. The metal plate may be part of a shielding in the form of a metal box surrounding the busbar.

FIG. 8(a) shows a cross section of the current sensor system 800 in the plane a, perpendicular to the longitudinal direction Y of the busbar. The position of the sensor device 802 in the transverse direction X is preferably substantially above the middle of the busbar 801. The height position "h" is not critical but is preferably substantially halfway between the top surface of the busbar 801 and the bottom surface of the metal plate 803, or the distance h from the busbar 801 may also be a value in the range from about 30% to about 70% of the distance "g" between the busbar 801 and the metal plate 803.

FIG. 8(b) shows a perspective view.

FIG. 8(c) is a schematic representation of a magnetic sensor device 802 with a single vertical Hall sensor (schematically represented by a black line), configured for measuring a magnetic field component Bx, oriented in the X-direction, parallel to the metal plate 803, in a transverse direction of the electrical conductor 802.

The sensor device 802 is configured for determining the current I in accordance with the formula: I=K*Bx, where Bx is the magnetic field component, and K is a constant, independent of frequency.

In a variant of this embodiment, the sensor device is located on the opposite side of the metal plate, i.e. above the metal plate in FIG. 8(a) and FIG. 8(b).

The same advantage (improved accuracy of AC current measurement) as described above is also obtained here. This embodiment is also robust against an external disturbance field, because of the shielding.

Figure 9:
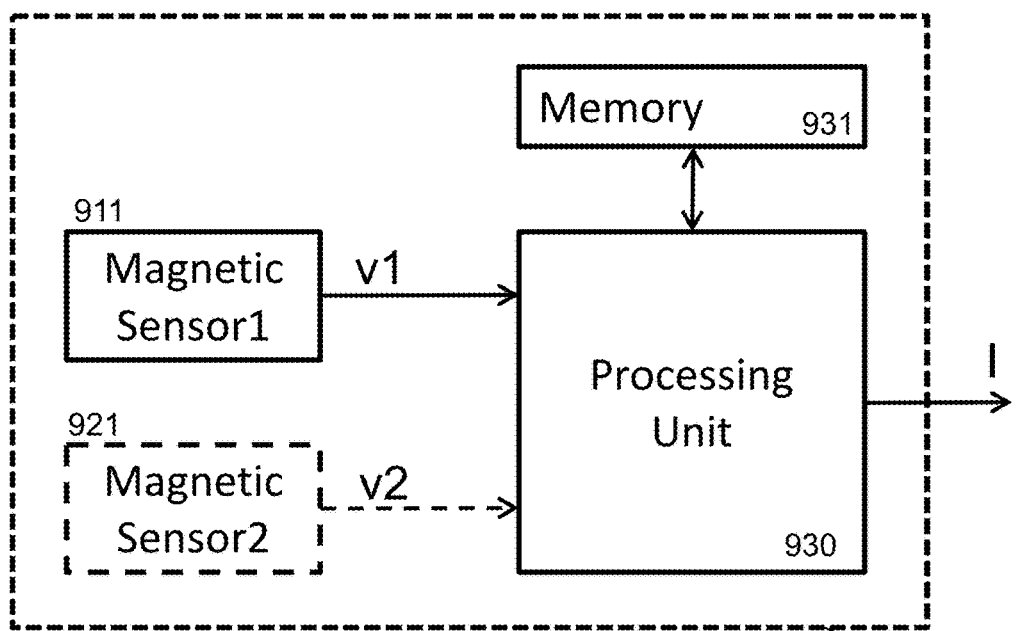
FIG. 9 shows an exemplary block-diagram of an electrical circuit which can be used in embodiments of the present invention.
Figure 10:
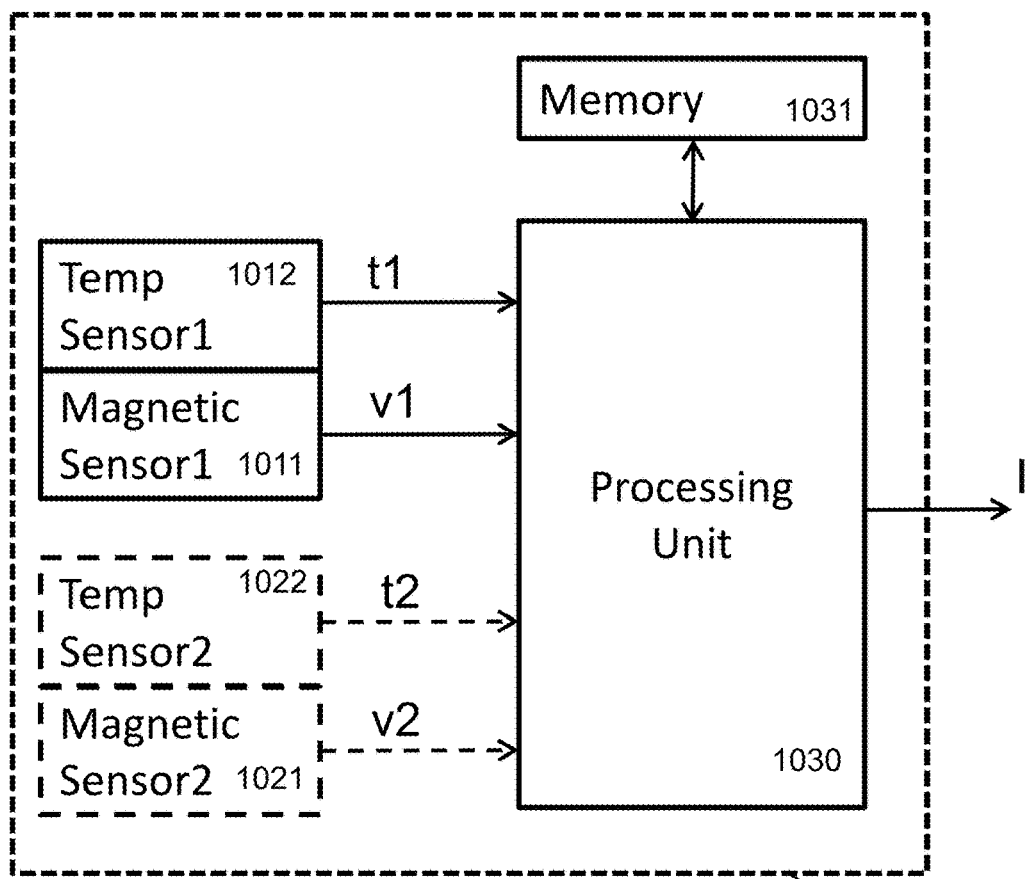
FIG. 10 shows an exemplary block-diagram of an electrical circuit which can be used in embodiments of the present invention.

While current sensor devices using one or more magnetic sensitive elements are known in the art, FIG. 9 and FIG. 10 are provided for completeness.

FIG. 9 shows an electrical block-diagram of a circuit 910 that can be used in current sensor devices of the embodiments described above. This block-diagram does not contain a temperature sensor or a stress sensor.

The processing unit 930 is adapted for determining the current to be measured by calculating the current according to the formula: I=K*v1, or I=K·(v1−v2), where K is a predefined constant, which may be determined during design, by simulation, or during an evaluation or calibration phase), v1 is the value provided by the first magnetic sensor 911 (or a value derived therefrom, e.g. after amplification), and v2 is the value provided by the second magnetic sensor 921 (or a value derived therefrom), if present. The subtraction may be done in hardware before amplification or after amplification or can be performed in the digital domain. The processing unit 930 may comprise a digital processor comprising or connected to a non-volatile memory 931 storing said at least one constant value K.

The processing circuit 910 may comprise a differential amplifier configured for determining and amplifying a difference between the first value v1 and the second value v2, and for amplifying this difference in the analogue domain. Alternatively, the processing circuit 910 may comprise an amplifier configured for selectively amplifying the first value v1 and the second value v2. The sensor device may further comprise an analog-to-digital convertor ADC configured for digitizing these amplified signals. The ADC may be part of a digital processor circuit.

The current to be measured may be provided as an analog output signal proportional to the current, or may be provided as a digital signal indicative of the current to be measured, for example via a digital data interface, for example a serial data bus (e.g. using the I2C protocol, or using RS232 protocol, or any other suitable protocol).

FIG. 10 shows an electrical block-diagram of a processing circuit 1010 which can be seen as a variant of the processing circuit 910 of FIG. 9, further comprising a first and/or a second temperature sensor 1012, 1022, communicatively connected to the processing unit 1030. The processing unit 1030 is adapted for determining the current to be measured based on one or both of the values v1 and v2, further taking into account one or both of the temperature signals t1, t2. The measured temperature(s) can be taken into account for compensating the measurement values v1, v2 for temperature variations, e.g. to compensate for sensitivity variations of the sensor elements. Such compensation techniques are known per se in the art, and hence need not be explained in more detail here.

In a particular embodiment, a temperature compensation is performed in a manner similar as described in EP3109658 (A1), which is incorporated herein by reference in its entirety.

It is an advantage of a current sensor that includes a temperature compensation mechanism. In this way, the accuracy of the current measurement can be further improved.

The processing unit 930 of FIG. 9 and 1030 of FIG. 10 may contain a digital processor, for example a programmable microcontroller. Although not explicitly shown, the circuit 910 and 1010 may also contain at least one analog-to-digital convertor, which may be part of the magnetic sensors, or may be part of the processing unit, or may be implemented as a separate circuit (e.g. between an output of the sensor circuit and an input of the processing unit). The block diagram of FIG. 9 and FIG. 10 does not show this level of detail, for the same reasons as it does not show a biasing circuit, a readout circuit, an optional amplifier, a power supply, etc., which are all well known in the art, and hence need not be described in detail here.

It is noted in this respect that if the signals v1, v2, t1 and t2 are analog signals, the processing unit 1030 may contain at least one ADC to convert these signals into digital signals, whereas in case the signals v1, v2, t1 and t2 are digital signals, the processing unit 1030 need not have an ADC.

It is an advantage of embodiments with two temperature sensors, one for each magnetic sensor, because the temperature of the first and second magnetic sensor may be substantially different, especially if a relatively high current is being measured in close vicinity of the busbar, because such a high current typically causes the busbar to warm up significantly, causing a relatively large temperature gradient over the substrate of the sensor device. In this way the accuracy of the current measurement can be further improved.

In a variant (not shown) of FIG. 10, the circuit comprises only one temperature sensor, which may be arranged for measuring the temperature of the first magnetic sensor, or for measuring the temperature of the second magnetic sensor. The temperature of the other magnetic sensor may then be estimated based on the estimated power dissipation (in turn based on v1 and v2) and/or based on a predefined assumption of the ambient temperature, instead of actually measuring the other temperature. Of course, an embodiment with two temperature sensors is more accurate.

In a variant (not shown) of FIG. 10, the circuit comprises one or two mechanical stress sensors instead of one or two temperature sensors, and the processing unit 1030 is adapted for determining the current based on the values obtained from the magnetic sensors, taking into account the stress value(s) obtained from one or both stress sensors.

In another variant (not shown) of FIG. 10, the circuit additionally comprises one or two stress sensors in addition to one or two temperature sensors, and the processing unit 1030 is adapted for determining the current based on the values obtained from the magnetic sensors and the one or more temperature sensors and the one or more stress sensors.

In an embodiment, each magnetic sensor element H1, H2 has an associated temperature sensor and an associated mechanical stress sensor, and the processing circuit is configured for measuring the two magnetic signals, and for measuring the two temperatures, and for measuring the two mechanical stress values, and is configured for determining ΔBz=Bz1−Bz2, and for multiplying the value ΔBz by a predefined constant factor K (independent of frequency), and for compensating the result for temperature and/or mechanical stress, for example using a polynomial expression of the temperature and/or stress, for example in a manner as described in EP3109658(A1), incorporated herein by reference in its entirety.

In the embodiments of FIG. 1(*a*) to FIG. 6(*g*), preferably no shielding is present around the busbar, or stated in other words, preferably these current sensor systems are "coreless". As mentioned above, the current sensor system of FIG. 8(*a*) and FIG. 8(*b*) may have a shielding.

In the drawings, only one busbar is shown, also in FIG. 1(*a*) to FIG. 1(*f*) where the busbar may be split in two parallel portions conducing in-phase currents, but of course the present invention is not limited thereto, and can also be used in a three-phase system.

The present invention is also directed to a current sensor system comprising three electrical conductors, and three magnetic sensor devices. The three electrical conductors may be arranged substantially in parallel. This three-phase current sensor system may comprise three separate metal plates, each of which is arranged relative to a corresponding busbar in a similar way as shown in FIG. 1(*a*) to FIG. 8(*b*), and each having a width Wp in a transverse direction of the busbar which is smaller than the distance between centres of adjacent busbars, e.g. having a width Wp in the range from 0.50 times to 0.95 times said distance. Alternatively, the three-phase current system may comprise a single printed circuit board (PCB) with at least three galvanically separate conductive regions. The PCB may be a multi-layer PCB.

The invention claimed is:

1. A current sensor system for measuring an AC electrical current having frequencies in a predefined frequency range, the system comprising:
   an electrical conductor configured for conducting said AC electrical current thereby creating a first magnetic field;
   a magnetic sensor device configured for measuring a first magnetic field component at a first sensor location, and for measuring a second magnetic filed component at a second sensor location spaced apart from the first sensor location, and for determining a magnetic field difference between said second magnetic field component;
   wherein the current sensor system further comprises a metal plate or an electrically conductive surface arranged in a vicinity of said electrical conductor for allowing eddy currents to flow in said surface thereby creating a second magnetic field which is superimposed with the first magnetic field;
   wherein the magnetic sensor device is configured for determining a magnitude of the AC electrical current as a signal or value proportional to said magnetic field difference in accordance with a formula: $I=K^*(\Delta Bz)$ or $I=K^*(\Delta Bx)$, where I is the magnitude of the AC electrical current to be measured, K is a predefined constant independent of frequency, and $\Delta Bz$ or $\Delta Bx$ is the magnetic field difference.

2. The current sensor system according to claim 1,
   wherein the magnetic sensor device is configured for measuring said first magnetic field component and said second magnetic field component, both oriented in a direction perpendicular to the metal plate or the electrically conductive surface; and
   wherein the first and second sensor location are spaced apart in a transverse direction of the electrical conductor.

3. The current sensor system according to claim 1,
   wherein the magnetic sensor device is configured for measuring said first magnetic field component and said second magnetic field component oriented in a transverse direction of the electrical conductor; and
   wherein the first and second sensor location are spaced apart in a direction perpendicular to the metal plate or the electrically conductive surface.

4. A current sensor system for measuring an AC electrical current having frequencies in a predefined frequency range, the system comprising:
   an electrical conductor configured for conducting said AC electrical current thereby creating a first magnetic field;
   a magnetic sensor device configured for measuring a first magnetic field component at a first sensor location;
   wherein the current sensor system further comprises a metal plate or an electrically conductive surface arranged in a vicinity of said electrical conductor for allowing eddy currents to flow in said surface thereby creating a second magnetic field which is superimposed with the first magnetic field;
   wherein the magnetic sensor device is configured for determining a magnitude of the AC electrical current as a signal or value proportional to said measured magnetic field component in accordance with a formula: $I=K^*(Bz)$ or $I=K^*(Bx)$, where I is the magnitude of the AC electrical current to be measured, K is a predefined constant independent of frequency, and Bz or Bx is the measured first magnetic field component.

5. A current sensor system for measuring an AC electrical current having frequencies in a predefined frequency range, the system comprising:
- an electrical conductor configured for conducting said AC electrical current thereby creating a first magnetic field;
- a magnetic sensor device configured for measuring a magnetic field component or a magnetic field difference;
- wherein the current sensor system further comprises a metal plate or an electrically conductive surface arranged in a vicinity of said electrical conductor for allowing eddy currents to flow in said surface thereby creating a second magnetic field which is superimposed with the first magnetic field;
- wherein the magnetic sensor device is configured for determining a magnitude of the AC electrical current as a signal or value proportional to said measured magnetic field component or said magnetic field difference;
- wherein the electrical conductor has an elongated shape extending in a first direction and has a width extending in a transverse direction, perpendicular to the first direction; and
- wherein the electrical conductor comprises a first cut-out extending from a first side of the electrical conductor over at least half of the transversal width, and has a second cut-out extending from a second side of the electrical conductor over at least half of the transversal width, the first cut-out and the second cut-out defining a transverse passage zone between them; and
- wherein the metal plate or the electrically conductive surface has an opening, or a non-conductive region located in a vicinity of said transverse passage zone; and
- wherein the metal plate or the electrically conductive surface is located at a first distance from the electrical conductor; and
- wherein the magnetic sensor device is arranged in a vicinity of said opening or of said non-conductive region at a second distance from the electrical conductor smaller than the first distance, or at a second distance larger than the first distance, or at a second distance substantially equal to the first distance.

6. The current sensor system according to claim 5,
- wherein the magnetic sensor device is configured for measuring a first magnetic field component at a first sensor location and a second magnetic field component at a second sensor location, said first and second magnetic field components oriented in a direction perpendicular to the metal plate or the electrically conductive surface; and
- wherein the first and second sensor location are spaced apart in a longitudinal direction of the electrical conductor.

7. A current sensor system for measuring an AC electrical current having frequencies in a predefined frequency range, the system comprising:
- an electrical conductor configured for conducting said AC electrical current thereby creating a first magnetic field;
- a magnetic sensor device configured for measuring a magnetic field component or a magnetic field difference;
- wherein the current sensor system further comprises a metal plate or an electrically conductive surface arranged in a vicinity of said electrical conductor for allowing eddy currents to flow in said surface thereby creating a second magnetic field which is superimposed with the first magnetic field;
- wherein the magnetic sensor device is configured for determining a magnitude of the AC electrical current as a signal or value proportional to said measured magnetic field component or said magnetic field difference;
- wherein the electrical conductor has an elongated shape extending in a first direction, and a width (Wp) extending in a transverse direction, perpendicular to the first direction; and
- wherein the electrical conductor comprises a first cut-out extending from a first side of the electrical conductor over at least half of the transversal width, and has a second cut-out extending from a second side of the electrical conductor over at least half of the transversal width, the first cut-out and the second cut-out defining a transverse passage zone between them; and
- wherein the metal plate or the conductive surface is parallel to the electrical conductor and is located on only one side of an imaginary plane oriented perpendicular to the first direction and situated in a middle between the first and second cut-out; and
- wherein the metal plate or the conductive surface is located at a first distance from the electrical conductor; and
- wherein the magnetic sensor device is arranged in a vicinity of said transverse passage zone at a second distance from the electrical conductor smaller than the first distance, or at a second distance larger than the first distance, or at a second distance substantially equal to the first distance.

8. The current sensor system according to claim 7,
- wherein the magnetic sensor device is configured for measuring a first magnetic field component at a first sensor location, and a second magnetic field component at a second sensor location, said first and second magnetic field components oriented in a direction perpendicular to the metal plate or the electrically conductive surface; and
- wherein the first and second sensor locations are spaced apart in a longitudinal direction of the electrical conductor.

9. A current sensor system for measuring an AC electrical current having frequencies in a predefined frequency range, the system comprising:
- an electrical conductor configured for conducting said AC electrical current thereby creating a first magnetic field;
- a magnetic sensor device configured for measuring a magnetic field component or a magnetic field difference;
- wherein the current sensor system further comprises a metal plate or an electrically conductive surface arranged in a vicinity of said electrical conductor for allowing eddy currents to flow in said surface thereby creating a second magnetic field which is superimposed with the first magnetic field;
- wherein the magnetic sensor device is configured for determining a magnitude of the AC electrical current as a signal or value proportional to said measured magnetic field component or said magnetic field difference;
- wherein the electrical conductor has an elongated shape extending in a first direction and has a width (Wp) extending in a transverse direction, perpendicular to the first direction; and
- wherein the current sensor system further comprises a magnetic shielding completely surrounding a portion of the electrical conductor or forming a bridge over a portion of the electrical conductor; and wherein the metal plate or conductive surface is oriented parallel to the electrical conductor, and is located at a first distance from the electrical conductor defining a gap between them; and wherein the magnetic sensor device is arranged in the gap between said electrical conductor portion and the conductive surface.

10. The current sensor system according to claim 9, wherein the magnetic sensor device is configured for measuring said magnetic field component oriented in the transverse direction of the electrical conductor.

11. A three-phase current sensor system for measuring three AC electrical current having frequencies in a predefined frequency range, the system comprising:

a first electrical conductor configured for conducting a first AC electrical current thereby creating a first magnetic field, and a first magnetic sensor device configured for measuring a first magnetic field component or a first magnetic field difference of the first magnetic field;

a second electrical conductor configured for conducting a second AC electrical current thereby creating a second magnetic field, and a second magnetic sensor device configured for measuring a second magnetic field component or a second magnetic field difference of the second magnetic field;

a third electrical conductor configured for conducting a third AC electrical current thereby creating a third magnetic field, and a third magnetic sensor device configured for measuring a third magnetic field component or a third magnetic field difference of the third magnetic field;

wherein the three-phase current sensor system further comprises a first metal plate or a first electrically conductive surface arranged in a vicinity of said first electrical conductor for allowing eddy currents to flow in said first plate or said first surface thereby creating a fourth magnetic field which is superimposed with the first magnetic field;

the three-phase current sensor system further comprises a second metal plate or a second electrically conductive surface arranged in a vicinity of said second electrical conductor for allowing eddy currents to flow in said second plate or said second surface thereby creating a fifth magnetic field which is superimposed with the second magnetic field;

the three-phase current sensor system further comprises a third metal plate or a third electrically conductive surface arranged in a vicinity of said third electrical conductor for allowing eddy currents to flow in said third plate or said third surface thereby creating a sixth magnetic field which is superimposed with the third magnetic field;

the first magnetic sensor device configured for determining a magnitude of the first AC electrical current as a signal or value proportional to the first magnetic field component or the first magnetic field difference measured by the first magnetic sensor device;

the second magnetic sensor device configured for determining a magnitude of the second AC electrical current as a signal or value proportional to the second magnetic field component or the second magnetic field difference measured by the second magnetic sensor device;

the third magnetic sensor device configured for determining a magnitude of the third AC electrical current as a signal or value proportional to the third magnetic field component or the third magnetic field difference measured by the third magnetic sensor device.

* * * * *